(12) United States Patent
Pyzza et al.

(10) Patent No.: US 9,899,643 B2
(45) Date of Patent: Feb. 20, 2018

(54) ENERGY STORAGE DEVICE ASSEMBLY

(71) Applicant: Ioxus, Inc., Oneonta, NY (US)

(72) Inventors: Jake Pyzza, Troy, NY (US); Robert Houston Lawler, Jr., Latham, NY (US); Tomas Sadilek, Schenectady, NY (US); Bryce Gregory, Port Crane, NY (US); Daniel Alexander Patsos, Otego, NY (US); Daniel Matthew Halbig, Ballston Lake, NY (US); Steve Andrew Correll, Schenectady, NY (US)

(73) Assignee: Ioxus, Inc., Oneonta, NY (US)

( * ) Notice: Subject to any disclaimer, the term of this patent is extended or adjusted under 35 U.S.C. 154(b) by 602 days.

(21) Appl. No.: 14/190,692

(22) Filed: Feb. 26, 2014

(65) Prior Publication Data
US 2014/0242436 A1 Aug. 28, 2014

Related U.S. Application Data

(60) Provisional application No. 61/837,681, filed on Jun. 21, 2013, provisional application No. 61/769,937, filed on Feb. 27, 2013.

(51) Int. Cl.
*H01M 2/10* (2006.01)
*H05K 7/20* (2006.01)
(Continued)

(52) U.S. Cl.
CPC ....... *H01M 2/1016* (2013.01); *H01M 10/655* (2015.04); *H05K 7/02* (2013.01); *H05K 7/20436* (2013.01); *H01M 2/24* (2013.01)

(58) Field of Classification Search
CPC ....... H01M 2/02; H01M 2/1016; H01M 2/105
See application file for complete search history.

(56) References Cited

U.S. PATENT DOCUMENTS 2,824,264 A 2/1958 Anastopoulos
4,460,887 A 7/1984 McAlear et al.
(Continued)

FOREIGN PATENT DOCUMENTS

CN 202127062 U 1/2012
EP 1178558 A2 6/2002
(Continued)

OTHER PUBLICATIONS

International application No. PCT/US2014/18625, International Search Report on Patentability, dated Mar. 26, 2015, 26 pages.
(Continued)

*Primary Examiner* — Alix E Eggerding
(74) *Attorney, Agent, or Firm* — Matthew J. Kinnier; Hoffman Warnick LLC

(57) ABSTRACT

The present disclosure includes various assemblies to be used with one or more energy storage devices. In one embodiment, an energy storage device assembly can include a plurality of energy storage devices, and each of these energy storage devices can include a first projecting electrode and a second projecting electrode. The energy storage devices can be connected to each other through a weld, which can directly bond the adjacent first and second projecting electrodes of adjacent energy storage devices to one another. This configuration can allow each of the energy storage devices to be connected together in series.

17 Claims, 23 Drawing Sheets

(51) Int. Cl.
  *H05K 7/02* (2006.01)
  *H01M 10/655* (2014.01)
  *H01M 2/24* (2006.01)

(56) References Cited

U.S. PATENT DOCUMENTS

| | | | |
|---|---|---|---|
| 4,863,812 A * | 9/1989 | Ueda | H01M 2/1022 |
| | | | 429/100 |
| 6,017,139 A | 1/2000 | Lederer | |
| 6,211,646 B1 | 4/2001 | Kouzu et al. | |
| 6,340,877 B1 | 1/2002 | Mita et al. | |
| 6,410,184 B1 | 6/2002 | Horiuchi et al. | |
| 6,656,632 B2 | 12/2003 | Asaka et al. | |
| 6,678,559 B1 | 1/2004 | Breyen et al. | |
| 7,029,787 B2 | 4/2006 | Bando et al. | |
| 7,580,245 B2 | 8/2009 | Inoue et al. | |
| 7,808,771 B2 | 10/2010 | Nguyen et al. | |
| 7,859,826 B2 | 12/2010 | Thrap et al. | |
| 7,859,844 B2 | 12/2010 | Nguyen et al. | |
| 8,018,712 B2 | 9/2011 | Yang et al. | |
| 8,030,901 B2 | 10/2011 | Nozu et al. | |
| 8,033,875 B1 | 10/2011 | Maguire | |
| 8,329,323 B2 | 12/2012 | Atkinson et al. | |
| 2002/0051340 A1 | 5/2002 | Oda et al. | |
| 2002/0086205 A1 | 7/2002 | Payen et al. | |
| 2002/0106414 A1 | 8/2002 | Gernert | |
| 2002/0182489 A1 | 12/2002 | Cheiky et al. | |
| 2003/0186114 A1 | 10/2003 | Lahr et al. | |
| 2004/0248002 A1 | 12/2004 | Asahina et al. | |
| 2004/0253512 A1 | 12/2004 | Watanabe et al. | |
| 2005/0070164 A1 | 3/2005 | Mita et al. | |
| 2006/0040112 A1 | 2/2006 | Dean et al. | |
| 2008/0013253 A1 | 1/2008 | Thrap et al. | |
| 2008/0068801 A1 | 3/2008 | Wilk | |
| 2008/0124617 A1 | 5/2008 | Bjork | |
| 2008/0152993 A1 * | 6/2008 | Seiler | H01M 2/1022 |
| | | | 429/92 |
| 2008/0160392 A1 | 7/2008 | Toya et al. | |
| 2008/0265586 A1 | 10/2008 | Like et al. | |
| 2008/0305388 A1 | 12/2008 | Haussman | |
| 2009/0004558 A1 | 1/2009 | Miyazaki et al. | |
| 2009/0080126 A1 | 3/2009 | Wilk et al. | |
| 2009/0104516 A1 * | 4/2009 | Yoshihara | H01M 2/105 |
| | | | 429/149 |
| 2009/0162747 A1 | 6/2009 | Zhu et al. | |
| 2009/0181288 A1 | 7/2009 | Sato | |
| 2009/0297892 A1 * | 12/2009 | Ijaz | B23K 26/323 |
| | | | 429/7 |
| 2009/0311891 A1 | 12/2009 | Lawrence et al. | |
| 2010/0028758 A1 * | 2/2010 | Eaves | H01M 2/105 |
| | | | 429/50 |
| 2010/0053927 A1 | 3/2010 | Inoue et al. | |
| 2010/0104927 A1 | 4/2010 | Albright | |
| 2010/0129703 A1 | 5/2010 | Caumont et al. | |
| 2010/0138064 A1 | 6/2010 | Wilk et al. | |
| 2010/0247997 A1 | 9/2010 | Hostler et al. | |
| 2010/0265660 A1 | 10/2010 | Nguyen et al. | |
| 2011/0007480 A1 | 1/2011 | Souda | |
| 2011/0027625 A1 | 2/2011 | Payne | |
| 2011/0039129 A1 | 2/2011 | Lee et al. | |
| 2011/0091759 A1 | 4/2011 | Song | |
| 2011/0177376 A1 * | 7/2011 | Maguire | H01M 2/1077 |
| | | | 429/151 |
| 2011/0189526 A1 | 8/2011 | Michelitsch et al. | |
| 2011/0206948 A1 | 8/2011 | Asai et al. | |
| 2011/0228484 A1 | 9/2011 | Sundstrom et al. | |
| 2011/0267778 A1 | 11/2011 | Eckstein et al. | |
| 2012/0003516 A1 | 1/2012 | Eisenhour | |
| 2012/0070699 A1 * | 3/2012 | Imaizumi | H01M 2/105 |
| | | | 429/7 |
| 2012/0141857 A1 | 6/2012 | Nakashima et al. | |
| 2012/0147633 A1 | 6/2012 | Jones | |
| 2012/0206877 A1 | 8/2012 | Park et al. | |
| 2012/0243142 A1 | 9/2012 | Schmit et al. | |
| 2012/0263988 A1 | 10/2012 | Obasih et al. | |
| 2012/0282510 A1 | 11/2012 | Youngs et al. | |
| 2012/0282810 A1 | 11/2012 | Myong | |
| 2012/0315528 A1 | 12/2012 | Rajaie et al. | |
| 2012/0328932 A1 | 12/2012 | Guen et al. | |
| 2013/0004820 A1 | 1/2013 | Tennessen et al. | |
| 2013/0107423 A1 | 5/2013 | Nieva Fatela et al. | |
| 2013/0266826 A1 | 10/2013 | Cowperthwaite et al. | |
| 2013/0337310 A1 | 12/2013 | Omura et al. | |
| 2014/0011059 A1 | 1/2014 | Hashimoto et al. | |

FOREIGN PATENT DOCUMENTS

| | | |
|---|---|---|
| EP | 1178558 A3 | 9/2003 |
| EP | 1804312 A2 | 4/2007 |
| EP | 1804312 A3 | 3/2010 |
| EP | 2284928 A2 | 12/2010 |
| JP | 06163314 A2 | 6/1994 |
| JP | 06223803 A2 | 8/1994 |
| JP | 2003282361 | 10/2003 |
| JP | 2004171856 A2 | 6/2004 |
| JP | 3774977 B2 | 5/2006 |
| JP | 2007179816 A2 | 7/2007 |
| JP | 2008251472 A2 | 10/2008 |
| JP | 2009188095 A | 8/2009 |
| JP | 2011009402 A2 | 1/2011 |
| JP | 2011521403 A | 7/2011 |
| JP | 2012064766 A2 | 3/2012 |
| JP | 2012134339 A2 | 7/2012 |
| WO | 2011096863 A1 | 8/2011 |
| WO | 2014134142 A2 | 9/2014 |
| WO | 2014134143 A1 | 9/2014 |

OTHER PUBLICATIONS

International application No. PCT/US2014/18627, International Search Report on Patentability, dated Mar. 27, 2015, 26 pages.
Patent Cooperation Treaty, International Search Report and the Written Opinion of the international Searching Authority for PCT/US2014/018625, dated Aug. 16, 2014, 19 pages.
Patent Cooperation Treaty, International Search Report and the Written Opinion of the international Searching Authority for PCT/US2014/018627, dated Jun. 12, 2014 , 13 pages.
U.S. Appl. No. 14/190,684, Office Action 1 dated Feb. 22, 2016, 32 pages.
U.S. Appl. No. 14/190,684, Office Action 2 dated Dec. 9, 2016, 24 pages.
Office Action and English Translation thereof for Chinese Patent Application No. 201480009958.5, dated Mar. 9, 2017, 25 pages.
U.S. Appl. No. 14/190,684, Final Office Action 1 dated Aug. 10, 2016, 27 pages.
U.S. Appl. No. 14/321,538, Office Action 1 dated Apr. 28, 2017, 39 pages.
U.S. Appl. No. 14/190,684, Notice of Allowance dated May 25, 2017, 14 pages.
Office Action and English Translation thereof for Chinese Patent Application No. 201480009970.6 dated Jul. 4, 2017, 23 pages.
EP Search Report and Opinion issued in connection with corresponding EP Application No. 14756949.5 dated Aug. 16, 2017, 7 pages.
EP Search Report and Opinion issued in connection with corresponding EP Application No. 14757206.9 dated Aug. 21, 2017, 10 pages.
Office Action and English Translation thereof for Japanese Patent Application No. P2015-559294, dated Sep. 5, 2017, 15 pages.
Office Action and English Translation thereof for Japanese Patent Application No. P2015-559293, dated Jul. 18, 2017, 5 pages.
U.S. Appl. No. 14/321,538, Notice of Allowance dated Oct. 17, 2017, 21 pages.

* cited by examiner

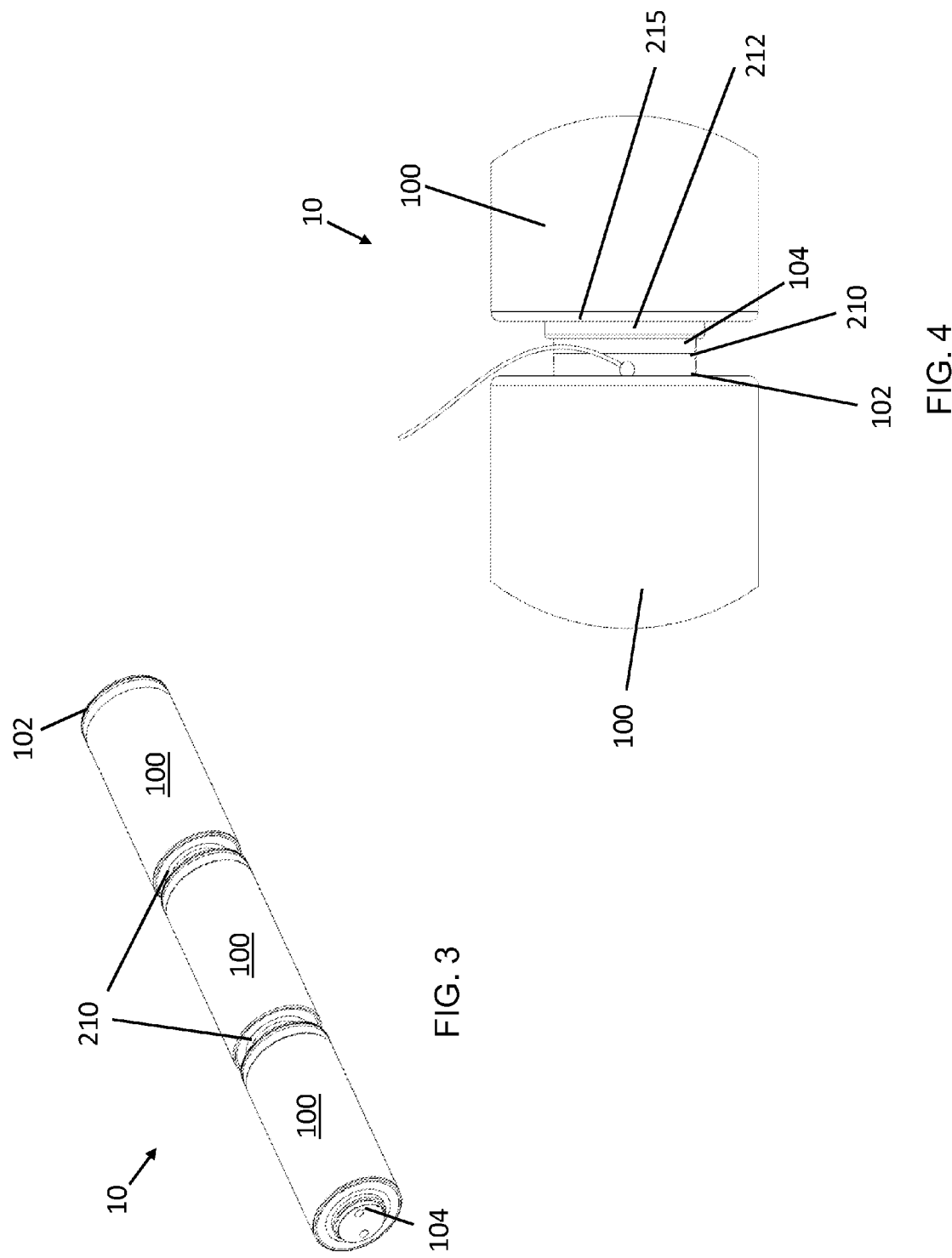

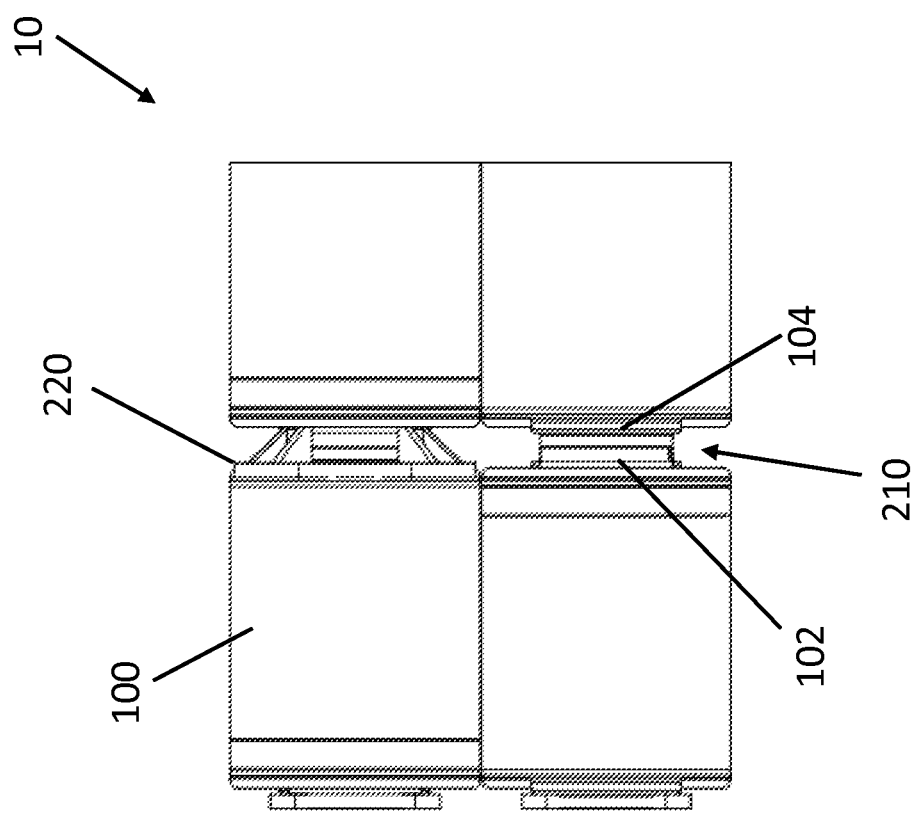

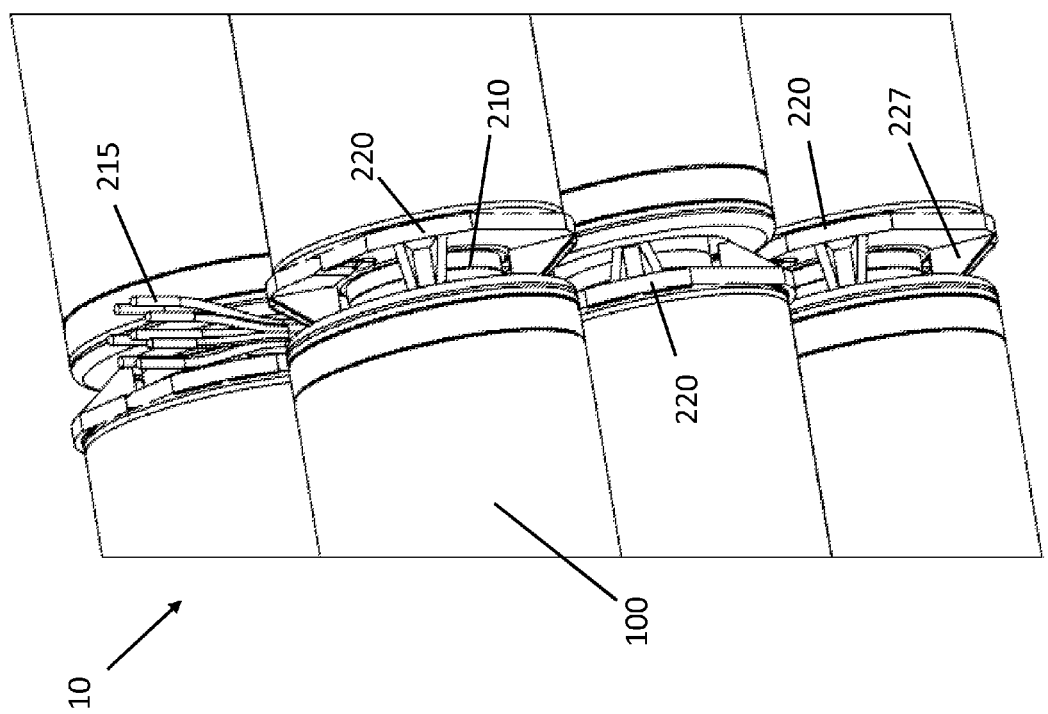

ENERGY STORAGE DEVICE ASSEMBLY

This application claims priority to previous U.S. Provisional Patent Application Nos. 61/769,937 filed Feb. 27, 2013, and 61/837,681 filed Jun. 20, 2013, both of which are hereby incorporated by reference.

BACKGROUND OF THE INVENTION

This disclosure relates generally to energy storage devices, and more particularly, to a modular assembly for one or more energy storage devices, including capacitors, ultracapacitors, and batteries.

In conventional capacitor assemblies, a plurality of capacitor cells, ultracapacitor cells, batteries, or other energy storage devices are loosely held together, through securing components, within a housing that can subject the cells to a certain amount of external forces, including vibratory forces. In some cases, these forces can exceed the strength of the securing components. In such cases, vibratory action can dislodge, rotate, wear and/or destroy portions of the devices and connections within and/or between them. This situation can reduce the durability and lifespan of the energy storage devices.

Some energy storage devices, including those with capacitor assemblies, may use adhesive substances and thermal inserts between capacitor cells. These components can dissipate heat generated during operation and reduce rotation and dislodging of the capacitor cells within the assembly, but are typically placed between capacitors and may be located along or nearby the path of an electric current. To connect energy storage devices together, complex bonding mechanisms between numerous surfaces may be used. These design choices have proven to impair the performance of energy storage devices, and can limit the opportunity to make further modifications.

Some capacitor assemblies use bus bars with circular ends to connect capacitor cells to one another. These bus bars can be designed to fully surround each end of a capacitor cell or an electrode. These circular ends must be precisely machined as close as possible to the shape of the end of the capacitor cell for the bus bars to properly contact and connect with a device. This limitation can greatly increase manufacturing time and/or produce an imprecise fit, leading to faulty and/or inconsistent performance.

In previous energy storage devices, such as traditional capacitor cells, a terminal is attached to an end of the cell through a radial weld or radial interference fit at an interface between the cell and the terminal. These points of attachment used complex geometries, with weld bonds located at several points of contact. Attachment points according to previous designs could cause difficulty or added complexity in manufacturing processes. In addition, a radial weld or radial interference fit can also cause attachment points between the cell and terminal to perform inefficiently or include imprecise geometrical connections.

BRIEF DESCRIPTION OF THE INVENTION

A first aspect of the present disclosure includes an energy storage device assembly comprising a plurality of energy storage devices, each energy storage device having a first projecting electrode and a second projecting electrode; and a weld directly bonding adjacent first and second projecting electrodes of adjacent energy storage devices to one another in series.

A second aspect of the present disclosure includes a bus bar comprising: a base; and a pair of opposing, arcuate ends coupled by the base, the pair of opposing, arcuate ends configured to engage and only partially surround two substantially circular projecting electrodes of two adjacent energy storage devices.

Another aspect of the invention includes An apparatus for use in an energy storage device assembly including a plurality of energy storage devices, the apparatus comprising: a structural thermal bridge including at least one thermal plate configured to engage an end of at least a pair of the plurality of energy storage devices to physically secure the energy storage devices and thermally communicate heat therefrom; and an elongated sleeve housing surrounding the plurality of energy storage devices, and the structural thermal bridge further comprises: a first thermal plate positioned between the elongated sleeve housing and a first end of the at least a pair of the plurality of energy storage devices, the first thermal plate including a plurality of recesses shaped to correspond to the first end of the at least a pair of the plurality of the energy storage devices; and a second thermal plate positioned between the elongated sleeve housing and a second end of at least a pair of the plurality of energy storage devices, the second thermal plate including a plurality of recesses shaped to correspond to the second end of the at least a pair of the plurality of energy storage devices.

A further aspect of the invention includes a housing for an energy storage device assembly comprising: an elongated sleeve having a contoured interior configured to enclose and contact each of a plurality of energy storage devices and a mount configured to retain a circuit board to the elongated sleeve housing.

An additional aspect of the invention includes an energy storage device assembly comprising: a plurality of energy storage devices, each energy storage device including a first projecting electrode and a second projecting electrode; and a weld bond electrically connecting respective first and second projecting electrodes of adjacent energy storage devices end-to-end.

Another aspect of the invention includes An energy storage device assembly comprising: a plurality of axially aligned energy storage devices each having electrodes, immediately adjacent energy storage devices being connected at a joint; an elongated sleeve housing having a length, the elongated sleeve housing enclosing the plurality of energy storage devices; a circuit board extending along the length of the elongated sleeve housing; and a plurality of substantially identical wiring harnesses for coupling the circuit board to the plurality of axially aligned energy storage devices.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3 shows a perspective view of several energy storage devices according to embodiments of the invention.

FIG. 4 shows a side view of two energy storage devices connected end-to-end according to embodiments of the invention.

FIG. 6 shows a side view of energy storage devices with a thermal insert according to embodiments of the invention.

FIG. 7D shows a perspective view of several energy storage devices in an assembly, with thermal inserts provided at joints between each energy storage device.

Figure 1:
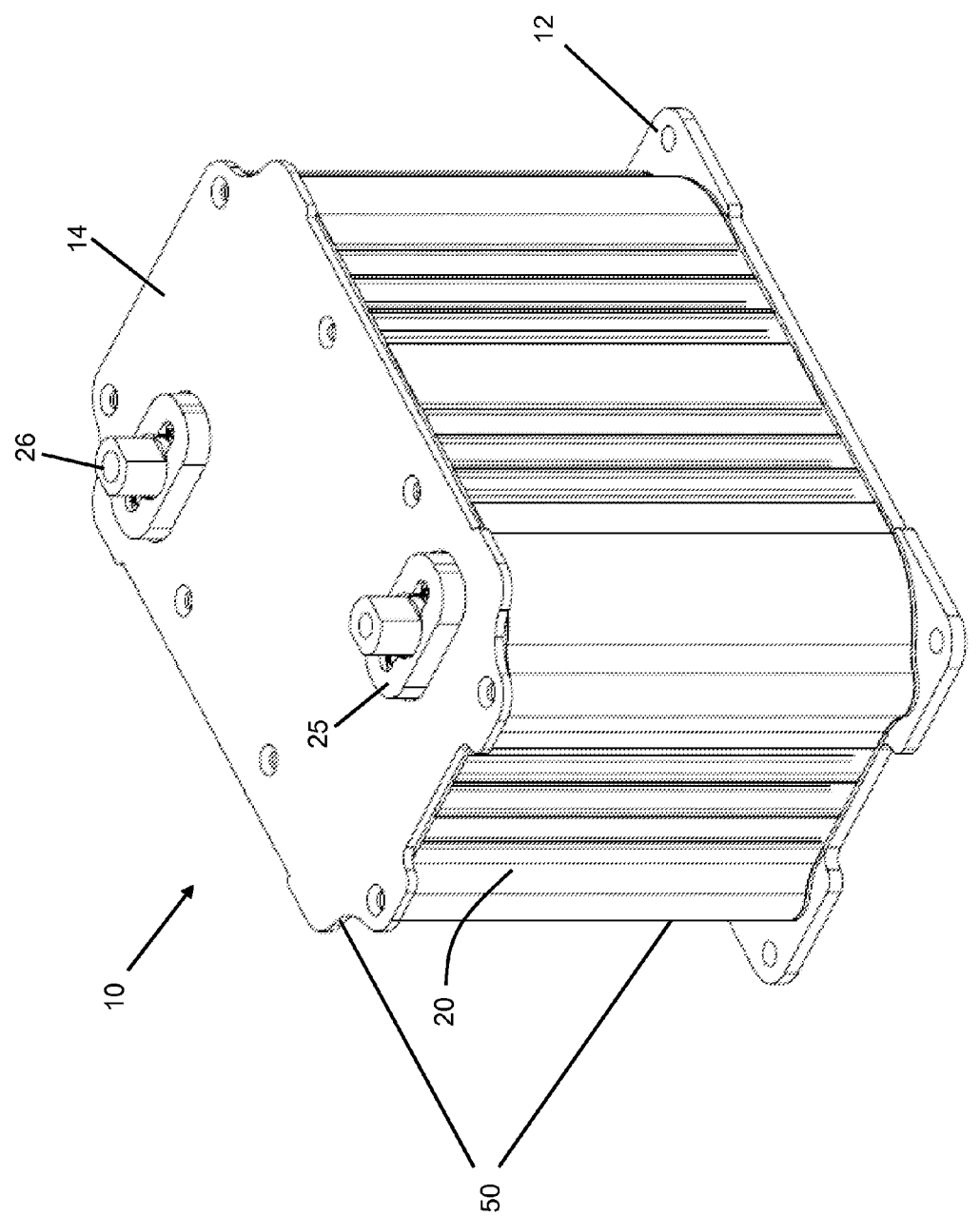
FIG. 1 shows an isometric view of an energy storage device assembly according to embodiments of the invention.

It is noted that the drawings of the invention are not necessarily to scale. The drawings are intended to depict only typical aspects of the invention, and therefore should not be considered as limiting the scope of the invention. It is understood that elements similarly numbered between the figures may be substantially similar as described with reference to one another. Further, in embodiments shown and described with reference to FIGS. 1-20, like numbering may represent like elements. Redundant explanation of these elements has been omitted for clarity. Finally, it is understood that the components of FIGS. 1-20 and their accompanying descriptions may be applied to any embodiment described herein. The detailed description explains embodiments of the invention, together with advantages and features, by way of example with reference to the drawings.

DETAILED DESCRIPTION OF THE INVENTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

When an element or layer is referred to as being "on," "engaged to," "disengaged from," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper," "inlet," "outlet" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
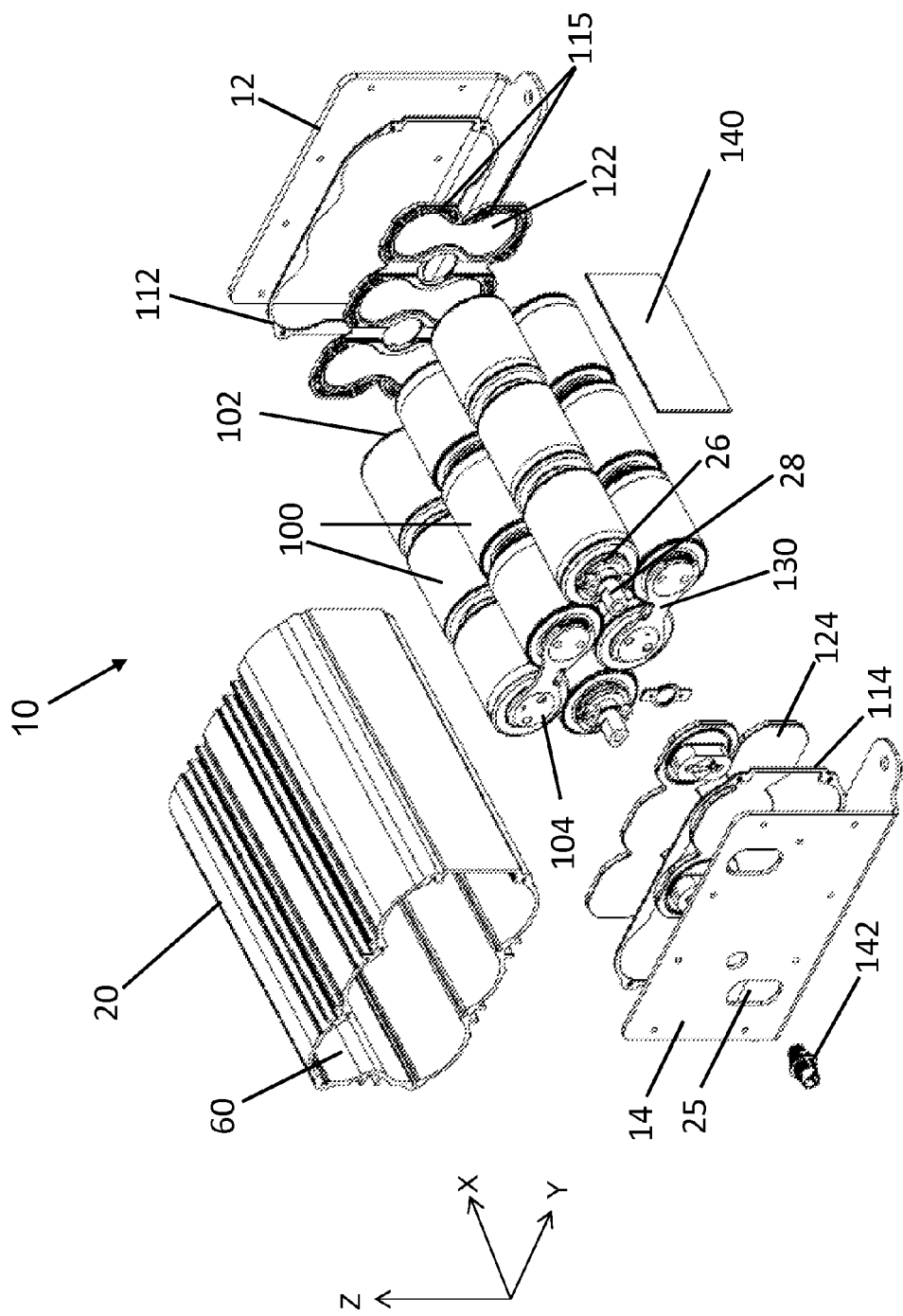
FIG. 2 shows an exploded view of an energy storage device assembly according to embodiments of the invention.

The present disclosure generally relates to assemblies of energy storage devices, including energy storage device assembly 10 depicted in FIGS. 1 and 2. According to embodiments of the disclosure, assembly 10 can permit several energy storage devices to be electrically connected to each other in series, with a joint such as a weld bond joining an electrode on an energy storage device with a successive energy storage device. As described in further detail herein, applying a weld bond to connect several energy storage devices in a series arrangement can avoid the use of components with higher resistances, such as conventional bus bars. Thus, assembly 10 can allow more energy storage devices to be joined by series connections, thereby providing a more effective energy storage apparatus that avoids the use of conventional bus bars.

Energy storage device assembly 10 can also be modular and thus scaled or altered to interact with a plurality of energy storage devices (e.g., sets of capacitors, sets of ultracapacitors, batteries, etc.), according to embodiments of the invention. For instance, energy storage device assembly 10 can be selected to contain a number of energy storage devices that allows for assembly 10 to have a predetermined operational value, including a predetermined voltage or capacitance. In other embodiments, energy storage device assembly can have several rows, with each row containing, for example, one, eight, ten, twenty, or any desired number of energy storage devices per row, with a number selected to yield a desired or pre-defined operational value. Several energy storage device assemblies 10 can be coupled together in a plurality of conceivable mounting variations, such as being stacked together, placed side-by-side, etc. (e.g., FIGS. 2, 6, 7D, 8A, 8B, 11B). In addition, the lengths of energy storage devices can be altered to provide discrete operational values for each device, and thus a different cumulative value for the assembly as a whole. Despite any changes in the size of energy storage devices, the same housing can be employed by cutting an extrusion of the housing to size, thus reducing manufacturing costs and complexity and providing flexibility in customizing for each different assembly's operational performance.

In some embodiments, energy storage device assembly 10 can include a first plate 12 and a second plate 14 located at opposing ends of a housing of energy storage device assembly 10. In some embodiments, and as further described herein, embodiments of the invention can include housings in the form of an elongated sleeve housing 20. Elongated sleeve housing 20 can be configured to contain various devices for electrically storing energy, including capacitor cells, ultracapacitors, batteries, and similar components. First and second plates 12, 14 can be located at opposing ends of elongated sleeve housing 20. First and second plates 12, 14, can include apertures 25 dimensioned to complement terminals 26 of devices 100, which can have connectors 28 mounted thereon, allowing them to pass through aperture 25. One or more terminals 26 can be made from an electrically conductive material, and terminals 26 can extend substantially through first or second plates 12, 14 via one or more corresponding apertures 25. First plate 12, second plate 14, and elongated sleeve housing 20 can also substantially enclose or fluidly isolate the contents of energy storage device assembly 10 and can be connected via adhesives, bolts, clasps, and/or any other means of connection. Together, as will be described herein, first plate 12 and second plate 14 can define a structural thermal bridge 50, which can allow thermal communication between elongated sleeve housing 20 and its contents or the environment beyond energy storage device assembly 10.

Turning to FIG. 2, an exploded view of an embodiment of energy storage device assembly 10 is shown. Energy storage device assembly 10 can include an elongated sleeve housing 20, with optional contours 60, surrounding energy storage devices 100. Optional contours 60 can complement and/or allow (thermal and/or actual) contact between elongated sleeve housing 20 and at least some or all of energy storage devices 100. Contours 60 allow a portion of each energy storage device 100 to contact elongated sleeve housing 20. In addition, energy storage devices 100 can be arranged to be in two lateral rows (along Z axis), with each row containing any desired number of energy storage devices in an axial direction (along X axis). In this fashion, each energy storage device 100 contacts (thermally and/or actually) elongated sleeve housing 20 without any energy storage devices 100 being separated from housing 20 by another energy storage device. In the embodiment shown, three lateral columns (along Y axis) are provided, creating a 'six pack' configuration (Z-Y plane). It should be recognized, however, that more or fewer columns may be provided. In any event, assembly 10 can be sized to any length capable of providing the desired operational performance (e.g., predetermined levels of voltage and/or capacitance). Energy storage devices 100 can be any device capable of storing electrical energy, including capacitor cells, ultracapacitors, batteries, electrical cells, and other similar components.

The embodiment in FIG. 2 is shown to include six axial rows (in X-axis) of energy storage devices 100, arranged in a six-pack or side-by-side fashion. The modular design of energy storage device assembly 10 and elongated sleeve housing 20 allow adjustment for accommodating energy storage devices 100 of different sizes and numbers. In an example embodiment, energy storage device assembly 10 can include modular a six-pack of energy storage devices 100 (e.g., FIGS. 2, 8B). Elongated sleeve housing 20 can be provided in varying shapes and dimensions to substantially complement, retain, and/or matingly receive energy storage devices 100. Retaining contact and/or mating engagement between energy storage devices 100 and elongated sleeve housing 20 can restrict movement of energy storage devices 100 within elongated sleeve housing 20 and/or provide thermal communication between energy storage devices 100 and elongated sleeve housing 20.

In some embodiments, elongated sleeve housing 20 can substantially secure a position of energy storage devices 100 relative to one another and/or elongated sleeve housing 20. Elongated sleeve housing 20 can include an electrically and/or thermally conductive material, including aluminum and similarly conductive metals. To provide a constant cross-sectional area, elongated sleeve housing 20 can be manufactured by extrusion and cut to a desired length. Forming elongated sleeve housing 20 by extrusion, and later cutting it to the length desired for a design parameter, allows energy storage device assembly 10 to be customized and shaped to have different lengths, contain different numbers of energy storage devices 100, and/or provide other adjustments without changing the structure of elongated sleeve housing 20 and/or energy storage device assembly 10.

Energy storage devices 100 can have a generally cylindrical geometry, as shown in FIG. 2, with a first projecting electrode 102, "projecting" from the end surface of energy storage device 100 at one end, and a second projecting electrode 104, similarly "projecting" from the end surface of energy storage device 100 at another end. As will be discussed in further detail below, first and second projecting electrodes 102, 104 can be substantially similar or uniformly sized on each energy storage device 100. Each energy storage device 100 can include first and second projecting electrodes 102, 104, which can be configured for several energy storage devices 100 to be connected to each other in series, as shown in FIG. 2. Two or more projecting electrodes 102, 104 of energy storage devices 100 can further include or be circumferentially connected to terminals 26. Terminals 26 can be either positive or negative contacts to act as electrical inputs and outputs, through which external circuits and devices can electrically access energy storage devices 100. Assembly 10 can further include first plate 12, and a first gasket 112 for sealing components within the assembly against first plate 12. Similarly, assembly 10 can further include second plate 14, and/or a corresponding second gasket 114 for sealing components within the assembly against second plate 14. First plate 12, first gasket 112, second plate 14, second gasket 114, and elongated sleeve housing 20 can thus be configured to substantially enclose and/or fluidly seal energy storage devices 100.

In some embodiments, assembly 10 can include a first thermal plate 122 located proximal to first plate 12 and/or a second thermal plate 124 located near or proximal to second plate 14. First and second thermal plates 122, 124 can have any material composition capable of communicating thermal energy and/or insulating electricity. For example, first and second thermal plates can include a thermal transmitting material, such as a plastic, epoxy, phase change material, and/or other similar and equivalent substances currently known or later developed. First thermal plate 122 and/or second thermal plate 124 can include contoured recesses 115 designed to matingly receive or retain energy storage devices 100 and/or their projecting electrodes 102, 104. Sets of contoured recesses 115 can provide an interference or plug-style fit with projecting electrodes 102, 104 and/or a circumferential fit with energy storage devices 100 themselves, thereby securing a position of energy storage devices 100 within elongated sleeve housing 20. In some embodiments, energy storage devices 100 can be substantially secured and/or retained between first thermal plate 122 and second thermal plate 124 by being connected at first and second projecting electrodes 102, 104 and/or surrounding structure to first and second thermal plates 122, 124.

Thermal plates 122, 124 are shown by example in the accompanying figures as being in the form of a continuous unit. It is also understood that each thermal plate 122, 124 can be in the form of several smaller plates, or that thermal plates 122, 124 may each be part of a larger thermal conduction assembly (e.g., FIGS. 2, 12). Other embodiments of the present disclosure can also include thermal insulation along the side of one or more energy storage devices 100, as an addition or alternative to thermal insulation at opposing ends of a particular row (e.g., FIG. 8). Thermal plates 122, 124 can offer several commercial and technical advantages, three examples of which include a high degree of heat transfer, improved structural support (including resistance to shocks and vibrations), and lower manufacturing costs.

Assembly 100 can further include one or more bus bars 130 for electrical coupling between energy storage devices 100, e.g., by way of projecting electrodes 102 and 104, directly or through intervening components such as electrodes. Bus bar 130 can optionally allow several projecting electrodes 102, 104 of adjacent energy storage devices 100 to be connected to each other. In this context, the term "adjacent" can refer to two or more cells locations that are immediately next to each other. Hence, bus bar 130 can connect or couple two or more energy storage devices 100 through physical connections, electrical connections, thermal connections, and other applicable forms of coupling.

As will be discussed in further detail herein, assembly 100 can further include a circuit board 140 coupled to energy storage devices 100. In some embodiments, a particular type of wiring harness used uniformly for each energy storage device 100, can provide electrical coupling between circuit board 140 and energy storage devices 100. In addition, an I/O connector 142 may be located on elongated sleeve housing 20 and coupled to circuit board 140 to provide an interface between circuit board 140, energy storage devices 100, and a user. Additional details regarding various embodiments of assembly 100 are discussed herein.

Figure 5:
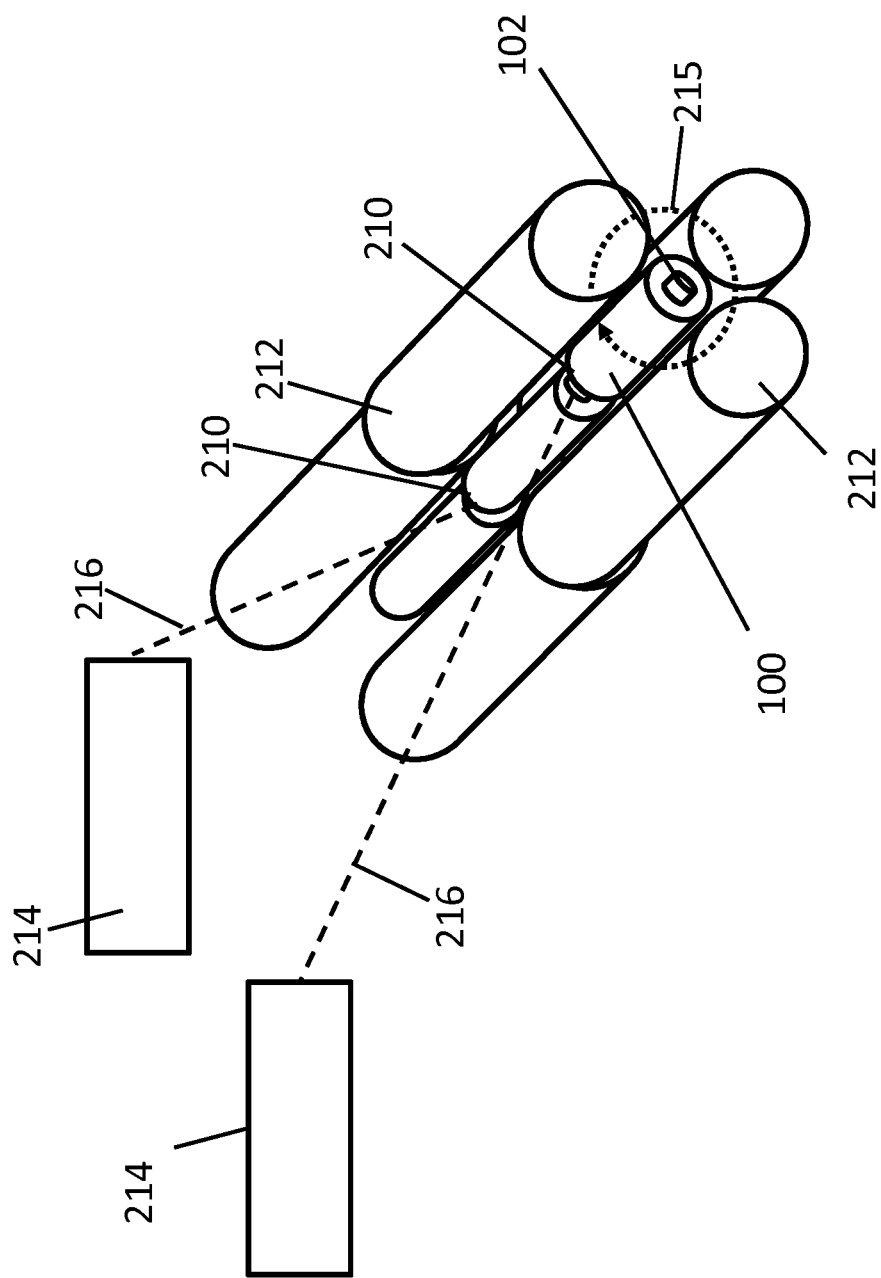
FIG. 5 shows a perspective view of a laser welding process according to embodiments of the invention.

An embodiment of the disclosure, illustrated in FIGS. 3-5, provides an energy storage device assembly 10 including a plurality of energy storage devices 100, such as capacitors, capacitor cells, ultracapacitor cells, and other components used to store energy. Each energy storage device can further include first projecting electrode 102 and second projecting electrode 104. First and second projecting electrodes 102, 104, are depicted as projecting from the surface of energy storage devices 100 at opposite ends and having corresponding substantially circular shapes. However, the disclosure also contemplates electrodes designed to have other shapes and geometries. To improve performance and reduce the use of components with relatively high resistances, such as previously discussed bus bars 130, one or more weld bonds 210 can be provided for direct bonding between adjacent first and second projecting electrodes 102, 104 of adjacent energy storage devices 100. Weld bonds 210 can therefore allow several energy storage devices 100 to be electrically connected to each other in series.

These series connections allow energy storage devices 100 to be linked in a chain of weld bonds 210 (also referred to herein as joints), allowing assembly 10 to be customizably scaled to applications where more or fewer energy storage devices 100 are desired. Furthermore, series connections between energy storage devices 100 can allow the same or similar housings to enclose variable lengths of energy storage devices 100. In some cases, housings or enclosures for energy storage devices 100 can be manufactured by extrusion and then dimensioned (e.g., by cutting) to separate a desired number of energy storage devices 100 having a predetermined operational value, such as a capacitance or voltage.

Turning to FIG. 3, a portion of energy storage device assembly 10 is shown and can include several energy storage devices 100. In some embodiments, energy storage devices 100 can be connected together in series. For example, energy storage devices 100 can be connected end to end, between first and second projecting electrodes 102, 104. Individual energy storage devices 100 can be connected to one another directly, without intervening elements, between projecting electrodes 102, 104 of energy storage devices 100 through weld bonds 210. An end-to-end configuration shown in FIGS. 3 and 4 for connecting energy storage devices 100 in series can further reduce the need for horizontal space as compared to situations where energy storage devices are placed in a side by side configuration. In some embodiments, energy storage devices 100 may be connected with weld bonds 210. Weld bonds 210 can be formed through a spot weld, a circumferential weld, a TIG (gas tungsten arc) weld, a MIG (gas metal arc) weld, an EB (electric) weld, a laser weld, or any other types of welding currently known or later developed. In one embodiment, laser welding can be used to form weld bond 210 by welding first and second projecting electrodes 102, 104 of energy storage devices 100 together along a single circumferential line of each immediately adjacent (X-axis FIG. 2) energy storage device 100.

Joining electrical storage devices 100 in this fashion can reduce the number of bus bars 130 used to connect ends of energy storage devices 100, as compared to assemblies in which energy storage devices are arranged in a structurally parallel fashion. Since bus bars 130 can have a relatively high level of electrical resistance, reducing their use also reduces resistance in the electrical connections provided between energy storage devices 100 used in assembly 10.

Turning to FIGS. 3-4, an end-to-end configuration of an energy storage device assembly 10 can include a plurality of energy storage devices 100, and each of these units in the plurality can include first projecting electrode 102 and second projecting electrode 104 at opposing ends of each energy storage device 100. As shown previously, energy storage devices 100 can be joined directly by a weld bond 210 between first projecting electrode 102 and second projecting electrode 104. Several weld bonds 210 can be implemented between pairs of energy storage devices 100 such that all or a portion of the plurality of energy storage devices 100 are electrically connected to each other in series.

As can be seen in FIG. 4, a first projecting electrode 102 of an energy storage device 100 can be connected to a second projecting electrode 104 of an adjacent energy storage device 100 via weld bond 210, thereby securely connecting energy storage devices 100 in series, optionally along a single circumferential line of contact. First and/or second projecting electrodes 102, 104 can also include a fastener 212, which can allow an electrical lead or contact 215 to be coupled to a joint between two energy storage devices 100.

Fastener 212 can take the form of a rivet that is inserted between energy storage devices 100 by driving a fastener 212 into first projecting electrode 102, second projecting electrode 104, or weld bond 210. Fastener 212 can be connected to wire 215 before being inserted, or wire 215 can be electrically coupled to fastener 212 after installation. Wires 215 coupled to fastener 212 can be used for coupling voltages or electric currents in energy storage devices 100 other locations, including sites in assembly 10, e.g., circuit board 140 (shown in FIG. 2). In some embodiments, a plurality of fasteners 212 can further be provided at series connections of energy storage devices 100 at a plurality of weld bonds 210 and/or projecting electrodes 102, 104, thereby joining a plurality energy storage devices 100 to circuit board 140 (shown in FIG. 2) via several wires 215.

Turning to FIG. 5, an example procedure for welding several energy storage devices 100 together is shown. Two or more energy storage devices 100 to be connected by a series connection can be positioned on top of rollers 212. For additional stability and ease of manufacture, a third roller 212 can be provided above and adjacent to energy storage devices 100 subject to welding. The energy storage devices 100 to be connected can also be aligned at their first and second protruding electrodes 102, 104. One or more laser welders 214 can be positioned proximate and/or above energy storage devices 100, such that laser welders 214 are each substantially aligned with points or surfaces of contact between energy storage devices 100. Laser welders 214 can then transmit welding beams 216 to energy storage devices 100 and form one or more weld bonds 210 between energy storage devices 100 as rollers 212 turn to rotate energy storage devices 100.

In some embodiments, the welding process can be simplified by keeping laser welders 214 stationary and imparting rotational motion 215 to energy storage devices 100 by actuating or applying energy to rollers 212, thereby providing the entirety of weld bond(s) 210 in a uniform fashion. In other embodiments, energy storage devices 100 can be stationary, while laser welders 214 rotate about the circumference of energy storage devices 100 to apply a laser welds through welding beams 216. Laser welder 214 can form weld bond 210 by varying the temperature of beams 216 as necessary (e.g. 3000° F., 2000° F., 1200° F., etc.). Further, it is understood that embodiments of the present disclosure are not limited to laser welding processes. Several energy storage devices 100 can also be bonded together with EB (electric), TIG (Tungsten Arc), and MIG (gas metal arc) welds if desired, in addition to any other adapted form of one or more currently known or later developed welding techniques.

Further embodiments of assembly 10, examples of which are included in FIGS. 6-8B, can include thermal transmitting mechanisms for conducting/transmitting heat from energy storage devices 100. In one embodiment, a thermal transmitting mechanism may include a thermal transmitting material, such as a plastic, resin, epoxy, phase-change material, or similar substance configured to communicate heat from energy storage devices 100 to other components, such as an elongated sleeve housing 20. As will be described in further detail below, thermal transmitting mechanisms can be provided as additional components within energy storage device assembly 10 that may, for example, be applied to energy storage devices 100, housings such as elongated sleeve housing 20, or other components. For example, as will be described herein, thermal transmitting mechanisms can be affixed to weld bonds 210, applied as a coating to the surface of energy storage devices 100, coated inside of housings such as elongated sleeve housing 20, and/or be provided as a liquid or solid substance interposed between energy storage devices 100 and a housing, such as elongated sleeve housing 20. The embodiments discussed with respect to each of FIGS. 6-8B each embody one or more thermal transmitting mechanisms, and other substantially similar mechanisms capable of insulating electricity while thermally conducting heat within and from energy storage device assembly 10.

Figure 7A:
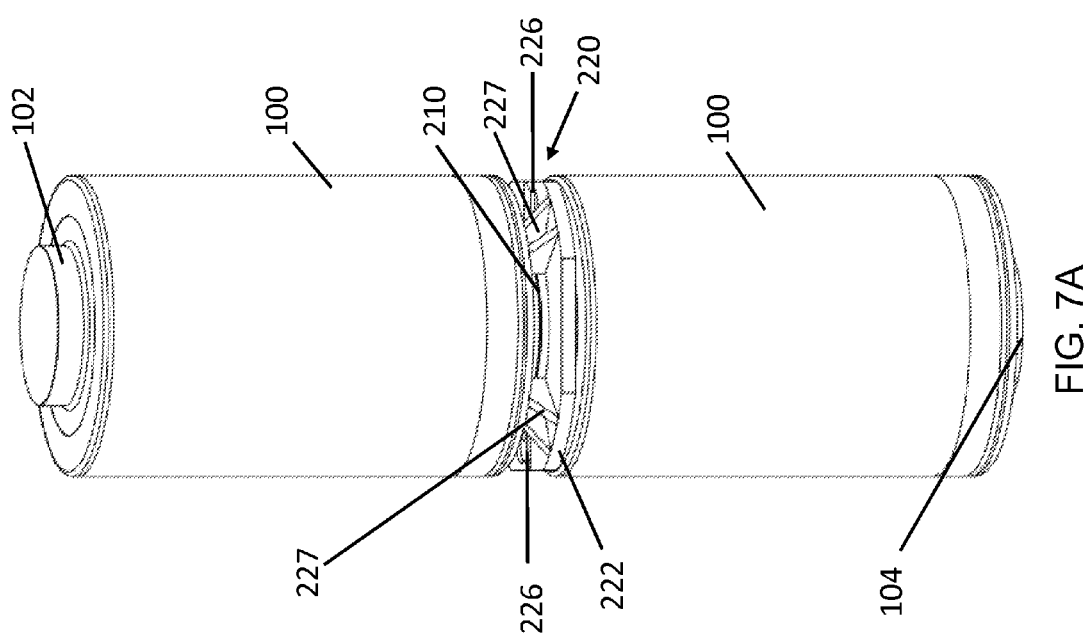
FIG. 7A shows a perspective view of a thermal insert according to embodiments of the invention.
Figure 7B:
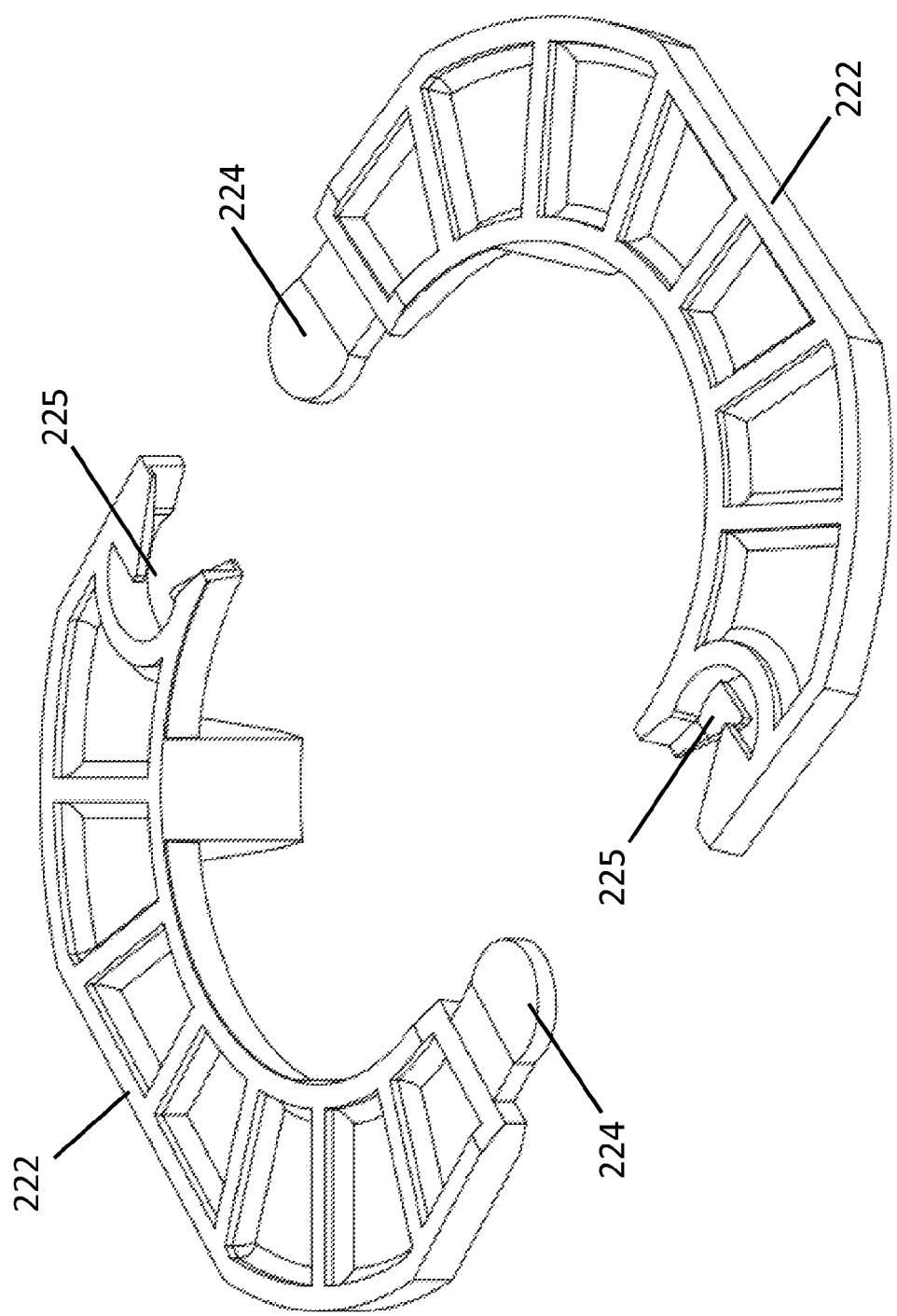
FIG. 7B shows a perspective view of two sub-portions of a thermal insert according to embodiments of the invention.
Figure 7C:
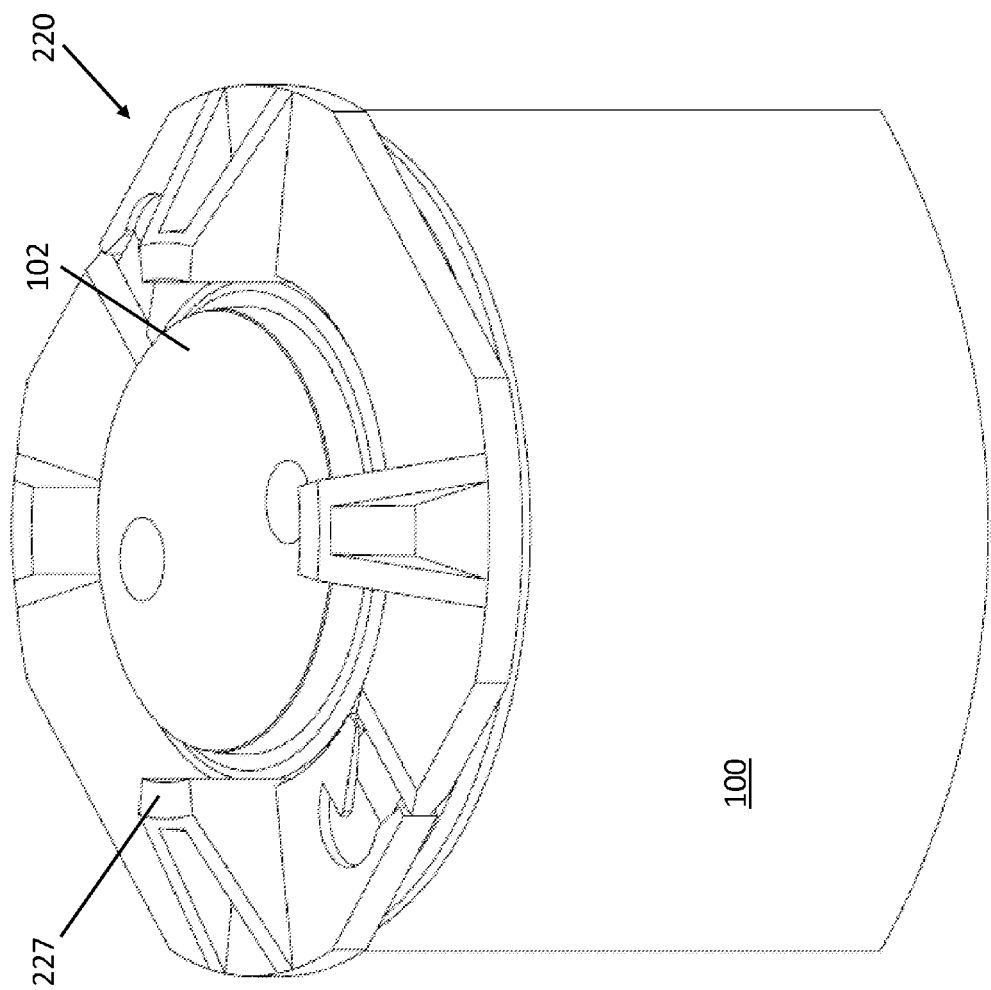
FIG. 7C shows a perspective view of a thermal insert located on a projecting electrode of an energy storage device, according to an embodiment of the invention.

Referring to FIGS. 6-7C, energy storage device assembly 10 can include thermal transmitting mechanisms in the form of one or more thermal inserts 220 between two energy storage devices 100. Thermal insert 220 is shown in FIG. 6 by way of example as being positioned about first and second projecting electrodes 102, 104 between energy storage devices 100. It is also understood that thermal insert 220 can be adapted to be positioned about several energy storage devices 100 simultaneously. Thermal insert 220 can have a material composition of plastic or similar substance capable of insulating an electrical current while transmitting heat from energy devices 100 and offering structural support. Energy storage devices 100 can contact enclosures or the elongated sleeve housing 20 (FIG. 2) through thermal insert 220, which in turn can act as a bridge or transitional component. The configuration of thermal insert 220 optionally allows heat to be communicated from energy storage devices 100 without altering the connection between them, including weld bonds 210 such that one or more thermal inserts 220 can be added to or removed from energy storage device assembly 10 as desired. Though FIG. 6 depicts only one thermal insert 220, embodiments of the disclosure can use any number of thermal inserts at connections between energy storage devices 100 to suit varying design requirements.

Thermal insert 220 can offer further customization when provided with a snap-fit design shown in FIGS. 7A-B. In some embodiments, thermal insert 220 can include sub portions 222, which can be installed on opposite sides of coupled first and second projecting electrodes 102, 104. Thermal insert 220 and its combined sub-portions 222 can have a ramped or sloped geometry, provided by axial protrusions 227, allowing for a greater area of contact between thermal insert 220 and energy storage device 100 on one side, and a lesser area of contact between thermal insert 220 and another energy storage device 100 on another side. As discussed below in the discussion accompanying FIG. 7D, this geometry allows thermal inserts 220 to be installed with alternating orientations, permitting a plurality of similar or substantially identical thermal inserts 220 to be used in one energy storage device assembly 10. As used in this specification, the term "substantially identical" refers to any two or more components which are identical or designed to be identical, accounting for minor or unexpected deviations with no effect on the component's performance, e.g. differences or errors caused during manufacture. Thermal insert 220 can include any number of thermal transmitting and electrically insulative materials, including plastics, phase-change materials, and/or other known and later discovered substances capable of communicating heat while insulating electricity. Thermal inserts 220 according to this embodiment are thus capable of being affixed and removed from electrodes 102, 104 without destroying weld bond 210, allowing a single assembly 10 to be adapted to different situations. In some embodiments, thermal inserts 220 can be used as an "internal structural thermal bridge" because of their ability to conduct heat while insulating electricity and structurally locating devices 100 relative to housing 20.

Sub-portions 222 can be configured to join with each other by a snap junction, coupling, or similar mechanical connection 226, thereby allowing thermal insert 220 to enclose a cross sectional area that is substantially equal to first and second electrodes 102, 104 but less than the cross sectional area of energy storage devices 100. Although sub-portions 222 can have mechanically distinct designs, sub-portions 222 can also be identical, and may feature mating contact points on opposing sides of a semi-circle. In some embodiments, thermal inserts 220 can allow wires 215 (FIG. 4) to run through thermal inserts 220 without being obstructed by them or impairing the transmission of electricity through the wires. Thermal insert 220 can be assembled by joining sub-potions 222 together at mechanical connections 226, for instance by inserting protrusion into receiving slot 225. As shown in FIG. 7B, one sub-portion 222 can be substantially semi-circular, including protrusion 224 on one side of sub-portion 222 and receiving slot 225 on another side. Other variants of sub-portions 222 can include designs with three or more components, or with geometries that are not substantially circular.

Turning to FIG. 7C, a design that can be used for some embodiments of thermal insert 220 is shown. FIG. 7C shows energy storage device 100 and projecting electrode 102 extending axially therefrom, with additional energy storage devices and weld bond 210 (FIGS. 2, 3, 4) omitted for the sake of demonstration. Thermal insert 220 is shown to have axial protrusions 227, with a sloped geometry and extending from approximately the circumference of energy storage device 100 to approximately the circumference of projecting electrode 102. The geometry of thermal insert 227 depicted in FIG. 7C therefore can contact energy storage device 100 at a greater surface area on one side, while contacting another energy storage device (not shown) on the other side.

FIG. 7D illustrates an advantage of designing thermal inserts 220 to have different surface areas on opposing sides through use of axial protrusions 227. In FIG. 7D, energy storage device assembly 10 is shown to include several energy storage devices, with thermal inserts 220 provided alongside weld bonds 210. Each thermal insert 220 can include axial protrusions 227, allowing for adjacent thermal inserts 220 to have alternating orientations. The alternating orientations allow each thermal insert 220 to have similar or substantially identical thermal designs, increasing both the scalability of energy storage device assembly 10 and any thermal communication between the various components.

Figure 8A:
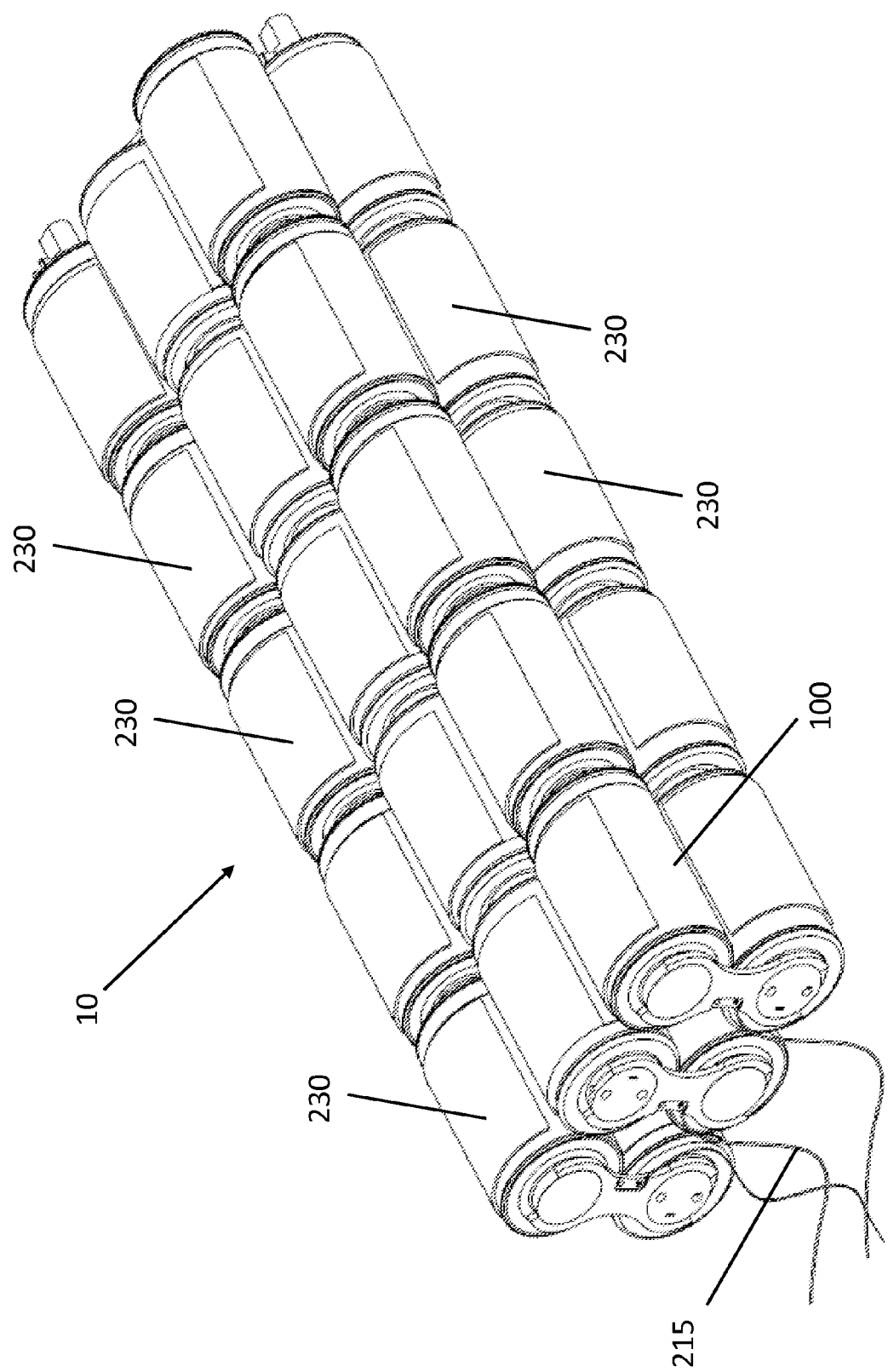
FIG. 8A shows a side view of energy storage devices with a thermal conducting layer according to embodiments of the invention.

As demonstrated by example in FIGS. 8A-8B, in another embodiment, each energy storage device 100 may include one or more thermal conducting layers 230 thereon, which can be provided in the form of coatings or layers 230 (hereinafter simply 'thermal layers'). Thermal layers 230 can be mounted on, placed on, or otherwise coupled or attached to energy storage devices 100, housings such as elongated sleeve housing 20 (FIG. 2), first and second thermal plates 122, 124 (FIG. 2), or any other component of energy storage device assembly 10. In other embodiments, thermal conducting layers 230 can generally be interposed between energy storage devices 100 and a housing, such as elongated sleeve housing 20 (FIG. 2). Thermal conducting layers 230 can be made from a material that allows heat to be transferred from energy storage device 100 into other components of an assembly 10, such as elongated sleeve housing 20. Similar to thermal insert 220, several thermal conducting layers 230 can be provided within assembly 10, allowing one or more thermal layers 230 to be included on one energy storage device 100 and/or on several energy storage devices 100. As energy storage devices 100 are arranged in two rows, each thermal layer 230 can be capable of transferring thermal energy directly to elongated sleeve housing 20 through thermal contact. Thermal layers 230 are shown in FIG. 8A as having substantially rectangular geometries that are shaped to match the substantially cylindrical outer surfaces of devices 100, but other geometries, including substantially quadrilateral, circular, and/or any simple or composite shape capable of being set upon or affixed to energy storage devices 100 are contemplated.

Including one or more thermal layers 230 can communicate or dissipate accumulated heat from energy devices 100 caused from operating assembly 10. Thermal layers 230 can assist in communicating heat from energy storage devices 100 to other areas within and outside energy storage device assembly 10, without being directly interposed between energy storage devices 100 at weld bonds 210. Either or both of thermal layers 230 and thermal inserts 220 can allow all of energy storage devices 100 to contact another component, such as a housing of assembly 10. Assemblies that include serial weld bonds 210 between energy storage devices 100 can be used, with or without any of the previously described modifications, along with any of the further additional components that can be included in energy storage device assembly 10. Thermal layers 230 can take the form of any now known or later developed material including but not limited to: a resin, an epoxy, or a phase change material. Thermal layers 230 can be selectively applied to the exterior of energy storage devices 100 and/or an interior of elongated sleeve housing 20 (FIG. 2) in any now known or later developed fashion, e.g., adhesion of a layer, coating, dipping, etc., that allows for quality thermal conduction.

Figure 8B:
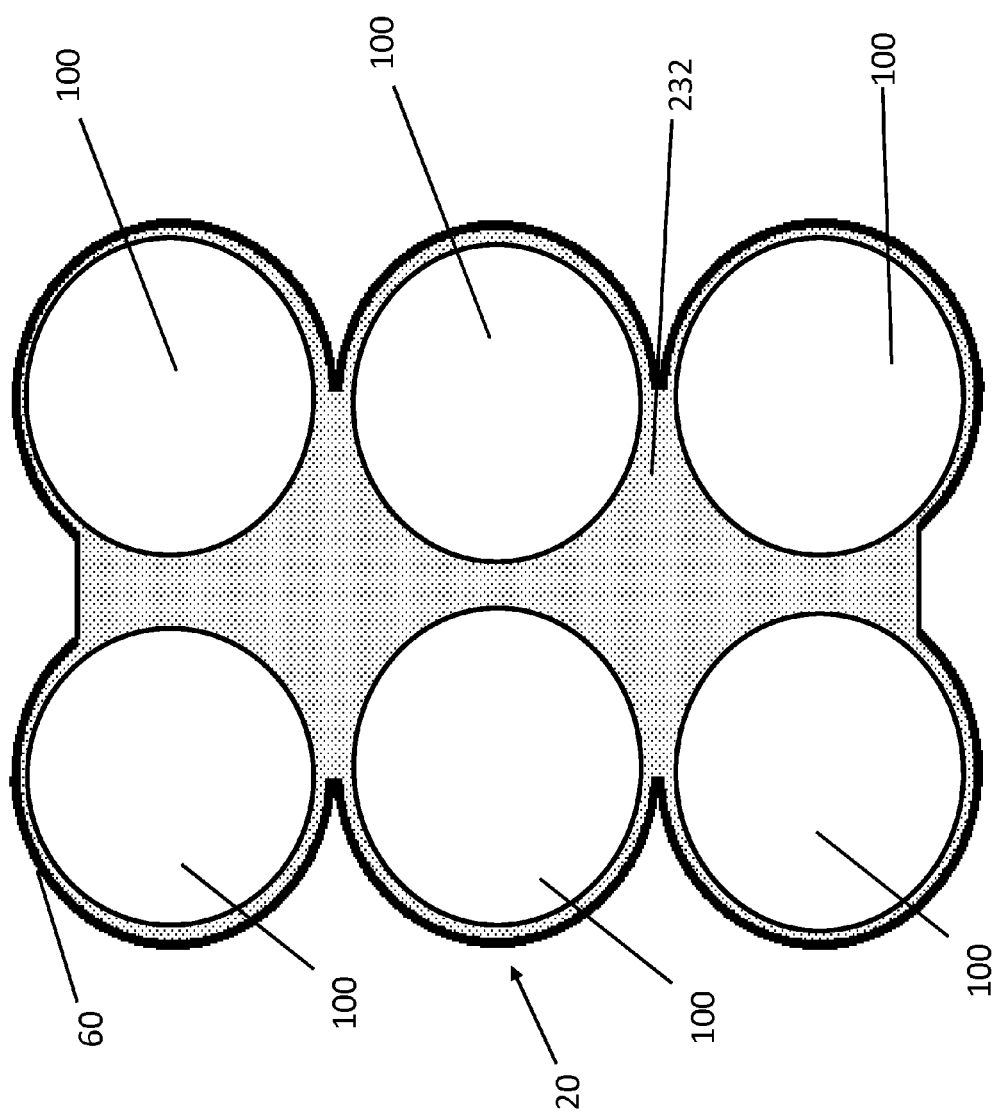
FIG. 8B shows a cross-sectional view of energy storage devices with a thermal conducting filler according to embodiments of the invention.

In another embodiment, shown in FIG. 8B, thermal transmitting mechanism may include a thermal filler 232. Thermal filler 232 can be provided as a resin, an epoxy or a phase change material. Thermal filler 232 can be installed by pouring, sliding, or mechanically inserting using any known or later developed process. As demonstrated in FIG. 8B, thermal filler 232 may take the form of a single, continuous component enclosing each energy storage device 100. In some embodiments, thermal filler 232 can be shaped with the same or similar contours 60 as elongated sleeve housing 20 (FIG. 2), and thereby transmit heat from energy storage device 100 to other components of energy storage device assembly 10 and/or an exterior environment. In another embodiment, thermal filler 232 can be partially applied by providing a resin, epoxy, phase-change material, or similar thermally conductive and electrically insulative material around energy storage devices 100 and/or within elongated sleeve housing 20 (FIG. 2), in a liquid or dry state.

Thermal filler 232 thus can take a shape that fills some or all of any gaps between energy storage devices 100 and an enclosure or elongated sleeve housing 20, while also surrounding any wires 215 (FIGS. 4, 8A) present within elongated sleeve housing 20 (FIG. 2). Thus, thermal filler 232 can be customized to take the form of individual units or a continuous unit, as may be desired for various deployments.

It is understood that the described thermal inserts 220 and/or thermal filler 230 may be used alone or in combination, and that the materials that make up the mechanisms may be customized to accommodate different thermal loads. For example, thermal transmitting mechanisms in some embodiments can include only one of a resin, epoxy, phase change material, or similar substances currently known or later developed. In addition, the chemical compositions of each thermal transmitting mechanism may be customized to provide a particular thermal transmissivity.

Figure 9:
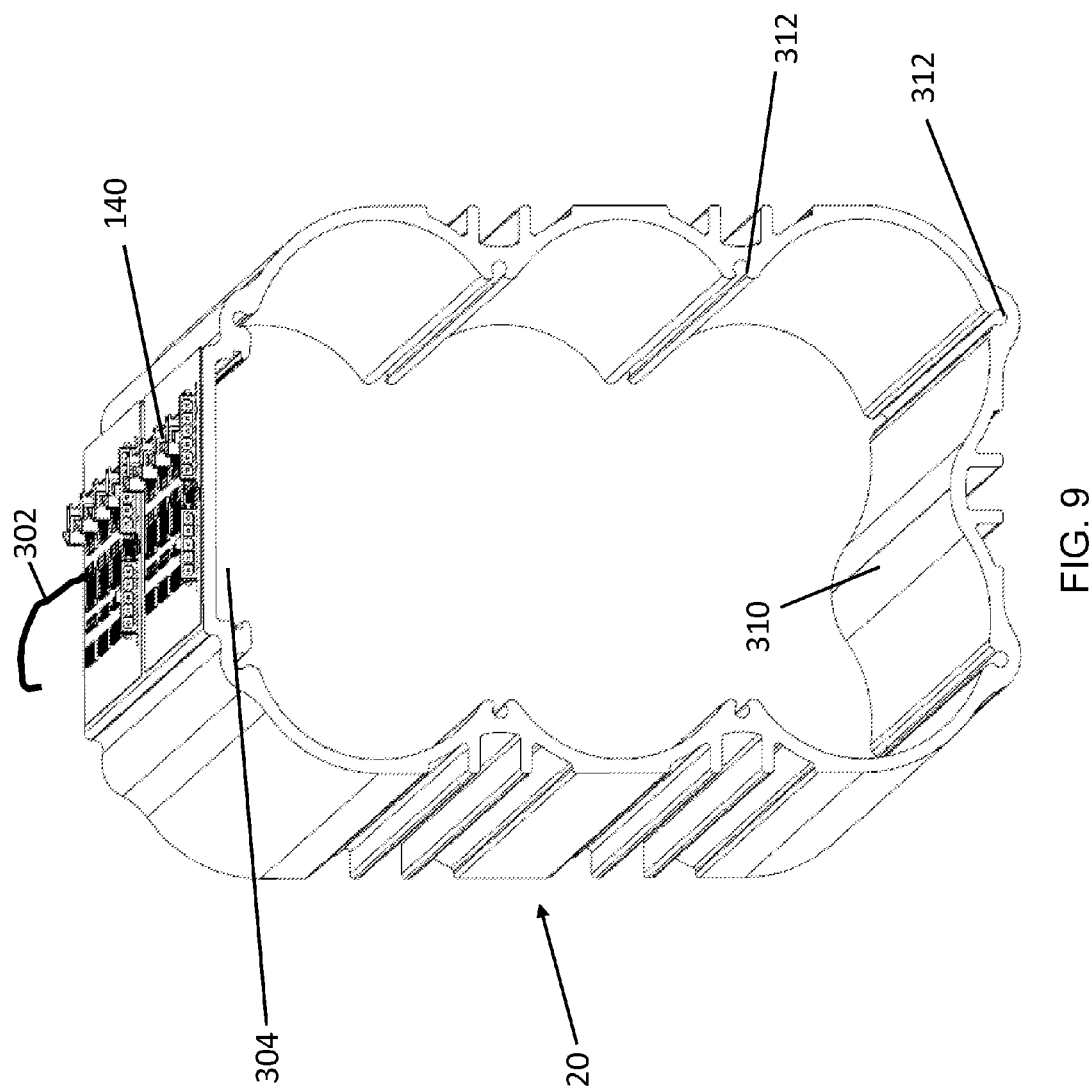
FIG. 9 shows a perspective view of an elongated sleeve housing according to embodiments of the invention.

An embodiment of the invention provides a housing in the form of an elongated sleeve housing. An example of an elongated sleeve housing, and accompanying components that can be used with embodiments of the invention, are shown in FIGS. 9-11B. In FIG. 9, elongated sleeve housing 20 is shown to be compatible with energy storage device assembly 10 (FIGS. 1-6). Elongated sleeve housing 20 can have a geometry configured to enclose a plurality of energy storage devices 100. In some embodiments, energy storage device assembly 10 can further enclose a circuit board 140, which can be coupled to the plurality of energy storage devices 100 with at least one wiring harness 302 (shown in more detail in FIGS. 11A, 11B).

Figure 10:
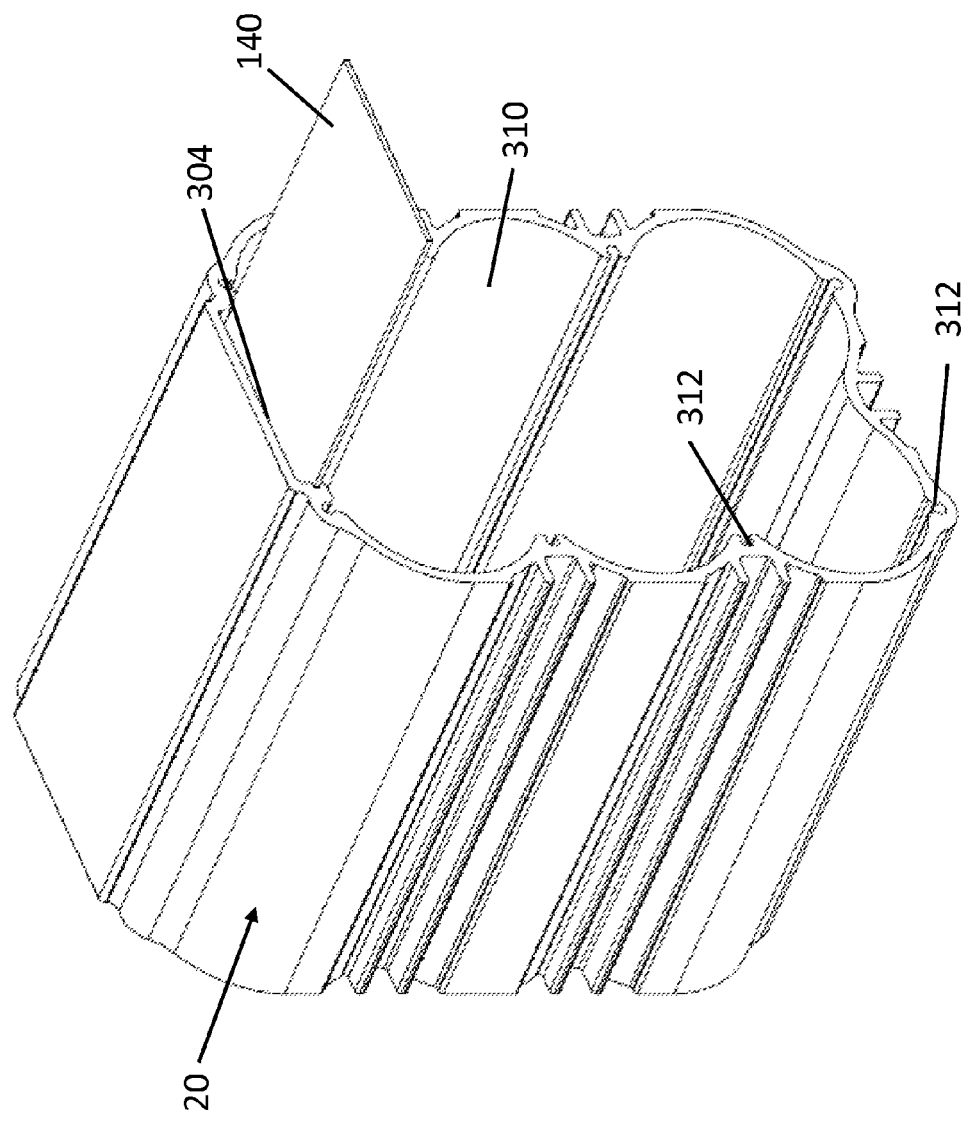
FIG. 10 shows a perspective view of an elongated sleeve housing and circuit board according to embodiments of the invention.

Wiring harness 302 can include a plurality of wires (shown further in FIGS. 11A, 11B) operative to electrically couple or connect circuit board 140 to energy storage devices 100, e.g., at joints, between energy storage devices 100 such as weld bond 210 (FIGS. 2, 3, 4). In some embodiments, circuit board 140 can be positioned along a length of housing 20 and retained within a mount 304 located within the interior of housing 20. As shown in FIG. 10, in one embodiment, elongated sleeve housing 20 includes mount 304 in the form of opposing slots that engage opposing sides/edges of circuit board 140 to allow circuit board to slidably engage elongated sleeve housing 20 and be retained therein. Other forms of mount 304 may also be possible. Circuit board 140 can further be positioned along a length of housing 20. Due to circuit board 140 being positioned along a length of housing 20 and the series positioning of energy storage devices 100, a wiring harness 302 having a single arrangement of wires can be used repeatedly throughout energy storage device assembly 10. In this fashion, electrical connections between circuit board 140 and each energy storage device 100 can be simplified, allowing the use of similar or substantially identical types of wiring harnesses 302 repeatedly, regardless of the number of energy storage devices 100 (FIG. 2) or the desired size of energy storage device assembly 10. Using substantially identical wiring harnesses 302 can lower the time and costs associated with manufacturing energy storage device assembly 10. As discussed herein, the term "substantially identical" can encompass situations in which the same generic components are used for each wiring harness 302, even when manufacturing errors cause variations between the individual wiring harnesses 302.

The design of elongated sleeve housing 20 features a uniform cross sectional area, and can be of a customizable length, allowing the number of energy storage devices 100 contained within to be customized without changing the shape of elongated sleeve housing 20, including its cross sectional area, which can further reduce the time and cost of manufacture.

In some embodiments, further measures can be employed to enhance thermal communication between energy storage devices 100 and elongated sleeve housing 20. For example, the plurality of energy storage devices 100 can be arranged in a plurality of rows, each row of energy storage devices 100 being in thermal contact with an interior 310 of elongated sleeve housing 20. In other embodiments, at least one of the plurality of energy storage devices 100 can also include thermal transmitting mechanisms, e.g., in the form of thermal layer 230 and/or thermal filler 232, shown previously in FIGS. 8A, 8B, interposed between the elongated sleeve housing 20 and at least one energy storage device 100.

In some embodiments, the elongated sleeve housing 102 can also include a plurality of interior grooves 312. Interior grooves 312 can be located within interior 310 of elongated sleeve housing at any desired position, as demonstrated by example in FIG. 9. Grooves 312 can retain one or more bolts or screws for coupling first and second thermal plates 122, 124 (FIG. 2).

Embodiments of elongated sleeve housing 20 include designs in which elongated sleeve housing 20 is a single component of substantially uniform cross sectional area, as depicted in FIGS. 9 and 10. Such designs allow for elongated sleeve housing to be manufactured with any desired length in which a set number of energy storage devices 100 can be contained within a cross sectional area of elongated sleeve housing 20. As a result, elongated sleeve housing 20 can allow energy storage device assembly 10 to be scalable to any desired length, and a desired number of series electrical connections between energy storage devices 100 can be provided in each implementation of assembly 10. Energy storage assembly 10 can be scaled as desired by manufacturing elongated sleeve housing 20 by extrusion to varying lengths of substantially uniform cross sectional area. The extruded elongated sleeve housing 20 can then be cut to size to enclose a desired number of energy storage devices 100, such that energy storage device assembly 10 can have a predetermined operational value, e.g., a predetermined voltage or capacitance.

Figure 11A:
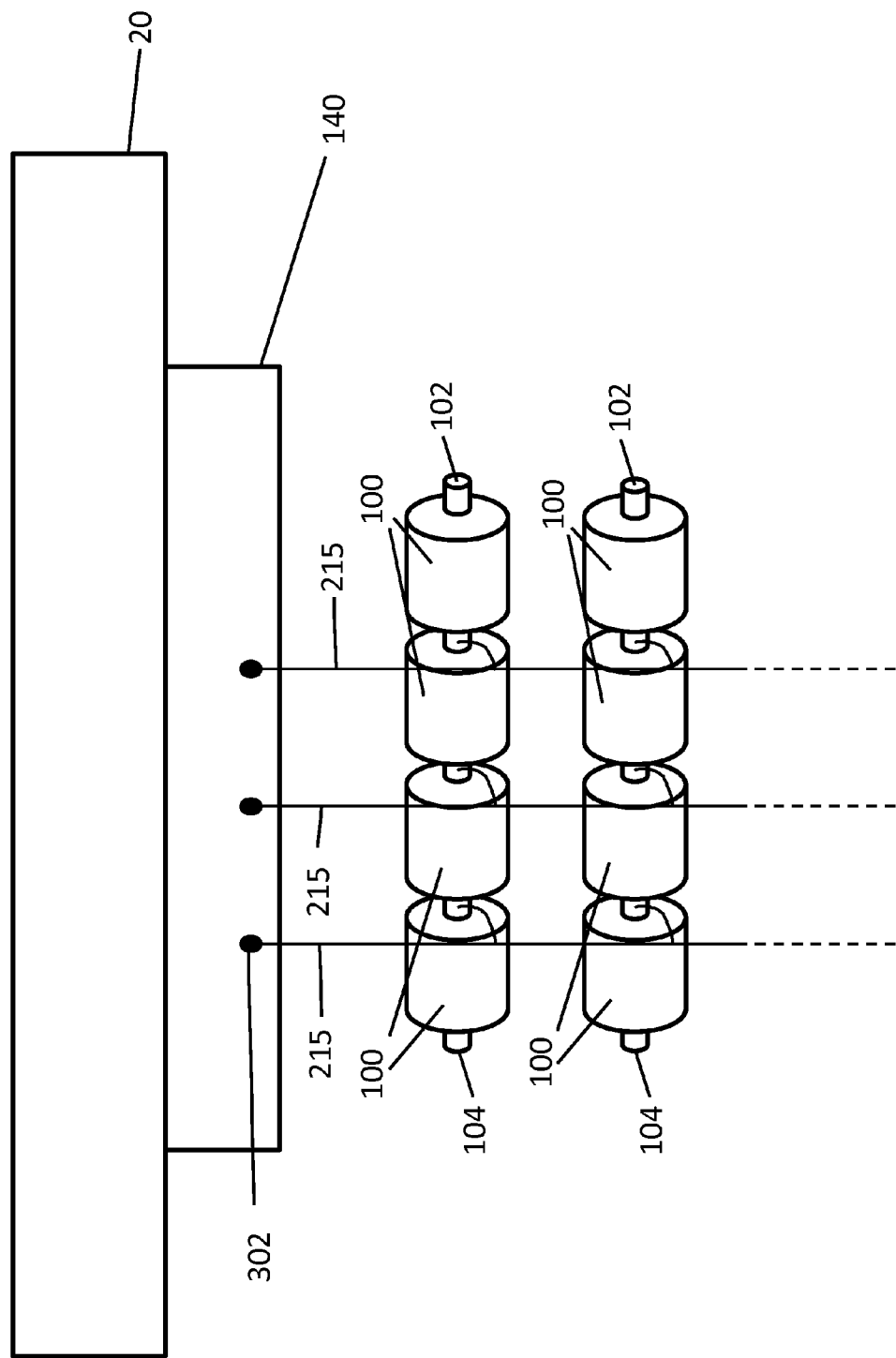
FIG. 11A shows a schematic view of a circuit board coupled to energy storage devices via a set of a single type of wiring harness according to embodiments of the invention.

Turning to FIG. 11A, an additional embodiment of elongated sleeve housing 20 is shown. Circuit board 140 is shown to be retained within elongated sleeve housing 20. Wire harnesses 302 can couple circuit board 140 to several wires 215, which can be provided as single wires, groups or wires, or an extension of a wire harness 302. Wires 215 thus can be electrically connected or coupled to first and/or second projecting electrodes 102, 104 of energy storage devices.

Figure 11B:
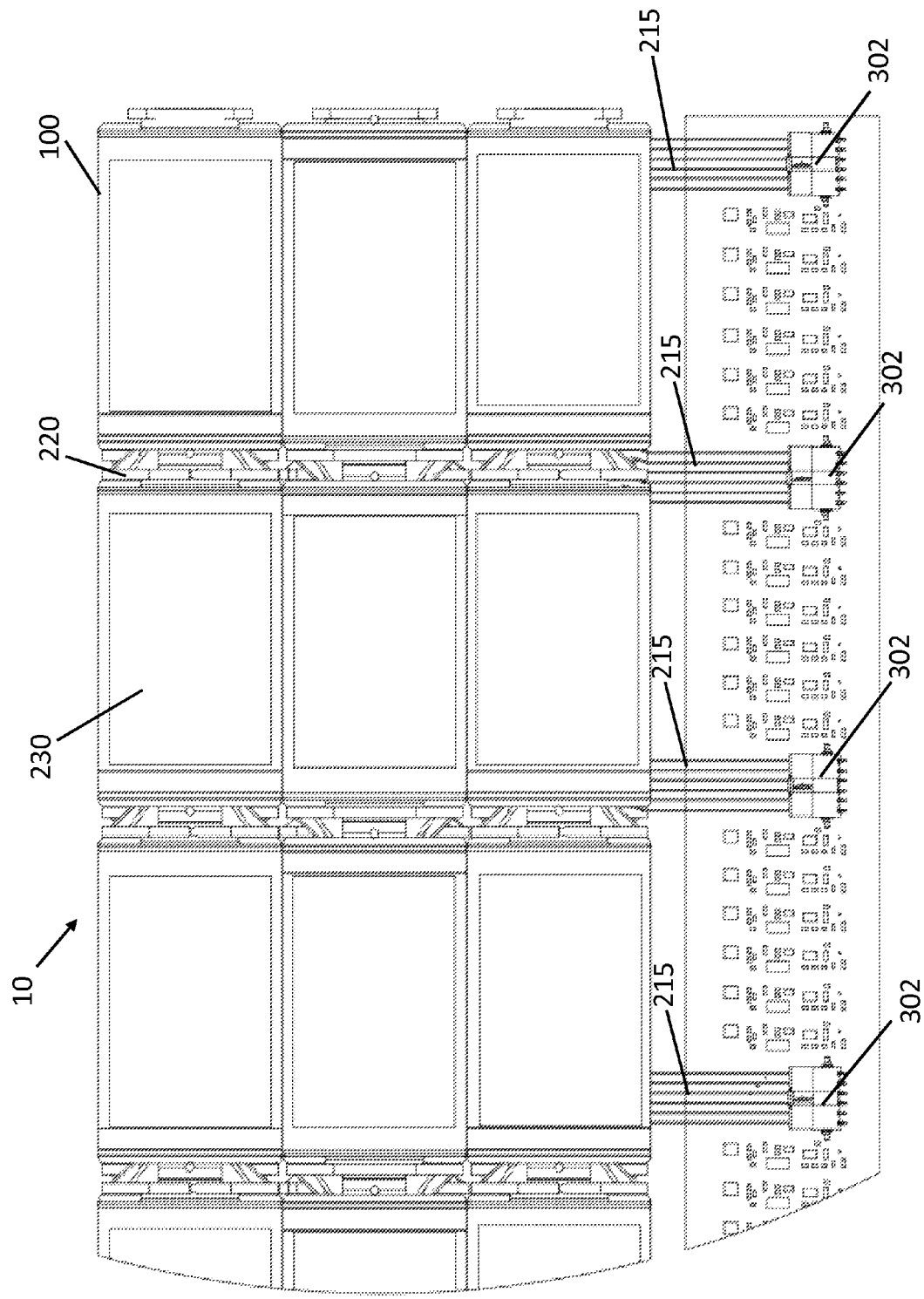
FIG. 11B shows an alternate, perspective view of a circuit board coupled to energy storage devices using a single type of wiring harness with a housing removed, according to an embodiment of the invention.

In FIG. 11B, a more detailed illustration of an embodiment of assembly 10 is shown. As was discussed with respect to FIG. 11A, circuit board 140 can be connected to several wires 215 through wire harnesses 302. Each wire 215, which can be provided singly, in a group, or as part of a wiring harness, can electrically connect circuit board 140 to at least one of energy storage devices 100.

As is further shown in FIG. 11B, consistent electrical couplings by wiring harnesses 302 can be provided in conjunction with providing thermal transmitting material, such as the previously discussed thermal inserts 220, thermal layers 230, and/or thermal filler 232. Each wiring harness 302 shown in FIG. 11B is shown as substantially identical to the others, allowing each connection between energy storage devices 100 and circuit board 140 to be consistent. Consistency or identity between each wiring harness 302 can also allow installation of thermal transmitting mechanisms (shown elsewhere), e.g., inserts (which can be further configured to retain wires 215 as discussed previously), thermal layers, and/or thermal filler. In some embodiments, wiring harnesses 302 can be used in user-customized or varying energy storage assemblies 10 without being redesigned or otherwise altered to have different lengths, thereby decreasing manufacturing time and costs.

Figure 12:
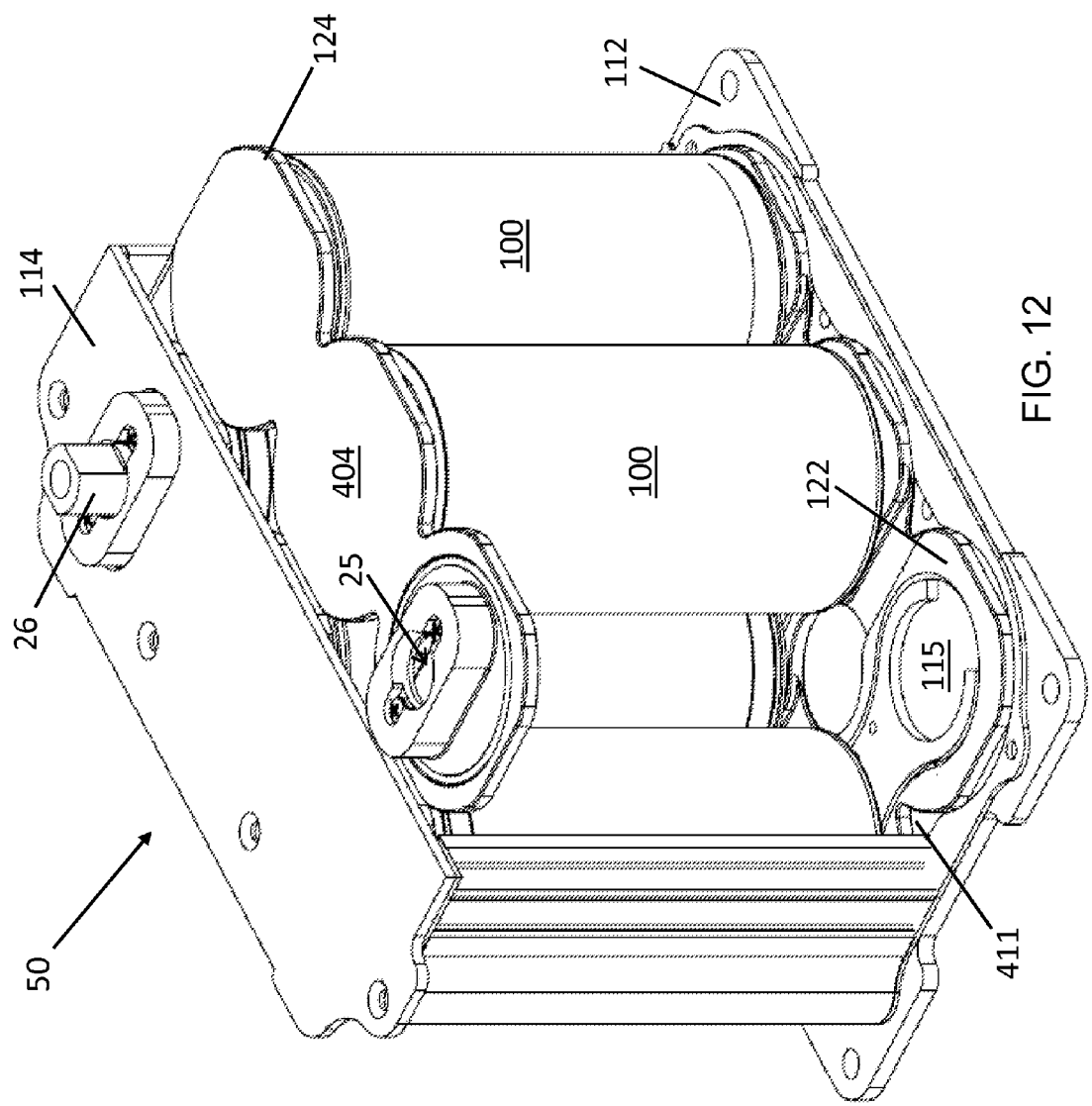
FIG. 12 shows a perspective view of a structural thermal bridge and energy storage devices according to embodiments of the invention.

As shown in FIG. 12, assembly 10 can further include first thermal plate 122, and second thermal plate 124, which can be coupled together to form structural thermal bridge 50. As described herein with respect to FIG. 2, and now shown in greater detail in FIG. 12, first thermal plate 122 can be positioned between first projecting electrodes 102 of energy storage devices 100 and first gasket 112, and second thermal plate 124 can similarly be positioned between second projecting electrodes 104 of energy storage devices 100 and second gasket 112. First and/or second thermal plates 122, 124 can define apertures 25 configured to complement or matingly receive terminals 26 connected to one or more energy storage devices 100.

As further shown in FIG. 12, thermal communication between energy storage devices 100 and other components can be increased in some embodiments by structural thermal bridge 50. In other embodiments, structural thermal bridge 50 can allow for all energy storage devices 100 in assembly 10 to be thermally connected to another structure, such as elongated sleeve housing 20. Structural thermal bridge 50 can include thermal plates 122, 124, which can be configured to restrain movement by energy storage devices 100, provide load distribution through energy storage device assembly 10, and improve thermal conduction to other components or structures, including elongated sleeve housing 20.

Recesses 115 can be shaped according to the component of an energy storage device assembly 10 that they complement or matingly engage. For example, recesses 115 can further be shaped to complement or matingly engage with a bus bar 130 coupled to a projecting electrode 102, 104 of energy storage device 100, terminal 26, or other components. Thermal plates 122, 124 can further be engaged with gaskets 112, 114 and further secure thermal plates 122, 124 to elongated sleeve housing 20 and/or first and second plates 12, 14. Including gaskets 112, 114 in an energy storage device assembly 10 can allow thermal plates 122, 124 of structural thermal bridge 50 to retain energy storage devices 100 within elongated sleeve housing 20, and thereby prevent or reduce rotational action against energy storage devices 100.

Structural thermal bridge 50 and/or thermal plates 122, 124 can communicate thermal energy throughout energy storage device assembly 10. Therefore, thermal plates 122, 124 offer structural support for energy storage devices 100, while also assisting in thermal management within assembly 10. The amount of thermal transmission to assembly 10 provided by structural thermal bridge 50, thermal plates 122, 124, thermal inserts 220, thermal layers 230, and/or thermal filler 232 can be predefined by selecting sizes, shapes, and materials used for these components. For example, thermal plates 122, 124 may be comprised of any thermally conductive material that also has an acceptable low bulk electrical conductivity as compared to the material composition of energy storage devices 100. In some embodiments, materials used in thermal plates 122, 124 can include talc, a talc filled mineral, a talc filled plastic and similar compositions.

Thermal plates 122, 124 can be customizably manufactured to accommodate various design considerations. In one example, shown in FIG. 12, first plate 122 can be formed to include a plurality of surface segments 404. Segments 404 can further include recesses 410. For example, some recesses 115 can be configured to mate with bus bars 130 on energy storage devices 100, while other recesses 115 can be configured to mate with terminals 16 located at first or second projecting electrodes 102, 104 of energy storage device 100. First thermal plate 122 and/or second thermal plate 124 can further include apertures 25, 411 to aid in thermal conduction and/or internal clearance.

Figure 13:
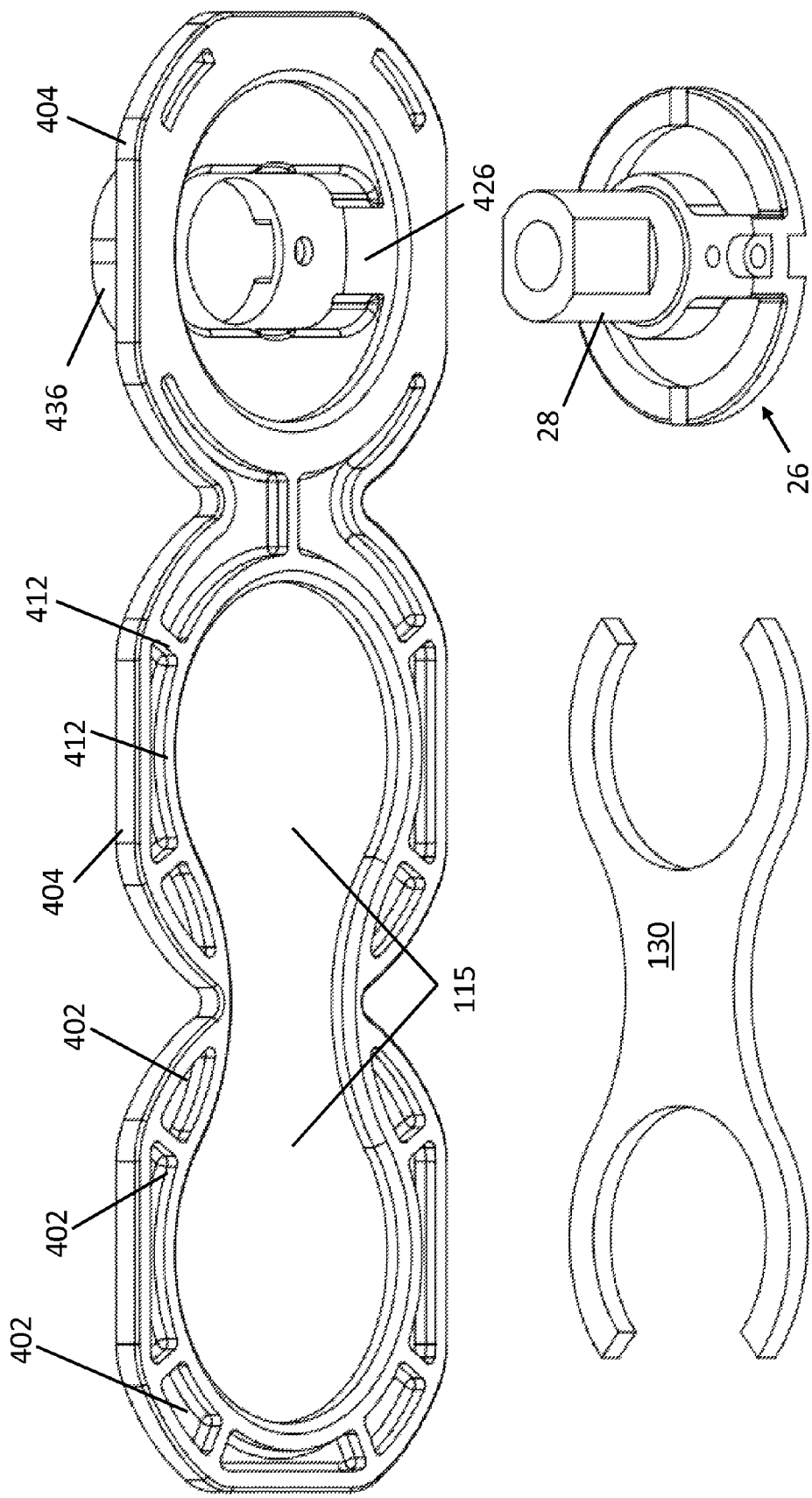
FIG. 13 shows a perspective view of a thermal plate, bus bar, and terminal according to embodiments of the invention.

Turning to FIG. 13, structural thermal bridge 50 and/or thermal plates 122, 124 can be provided with apertures 402, surface segments 404, and/or other structural components. As described herein, surface segments 404 of thermal plates 122 and 124 can each include a plurality of recesses 115, which can be configured as ribs, ridges, and/or indentations. Each recess 115 can be configured to complement all or part of an energy storage device 100, including projecting electrodes 102, 104 (shown in FIGS. 2, 4, 6, 7).

First and second thermal plates 122, 124 can also include several segments 404, including two or more recesses 115 defined by a set of ridges 412, which can complement or matingly receive various components, such as bus bar 130. First and/or second thermal plates can further include a terminal recess 426 configured either to complement or matingly receive terminal 26. Segments 404 can include a pocket 436 configured to receive at least a portion of terminal 26 and/or connector 28. In some embodiments, pocket 436 can project from surface 404.

Figure 14:
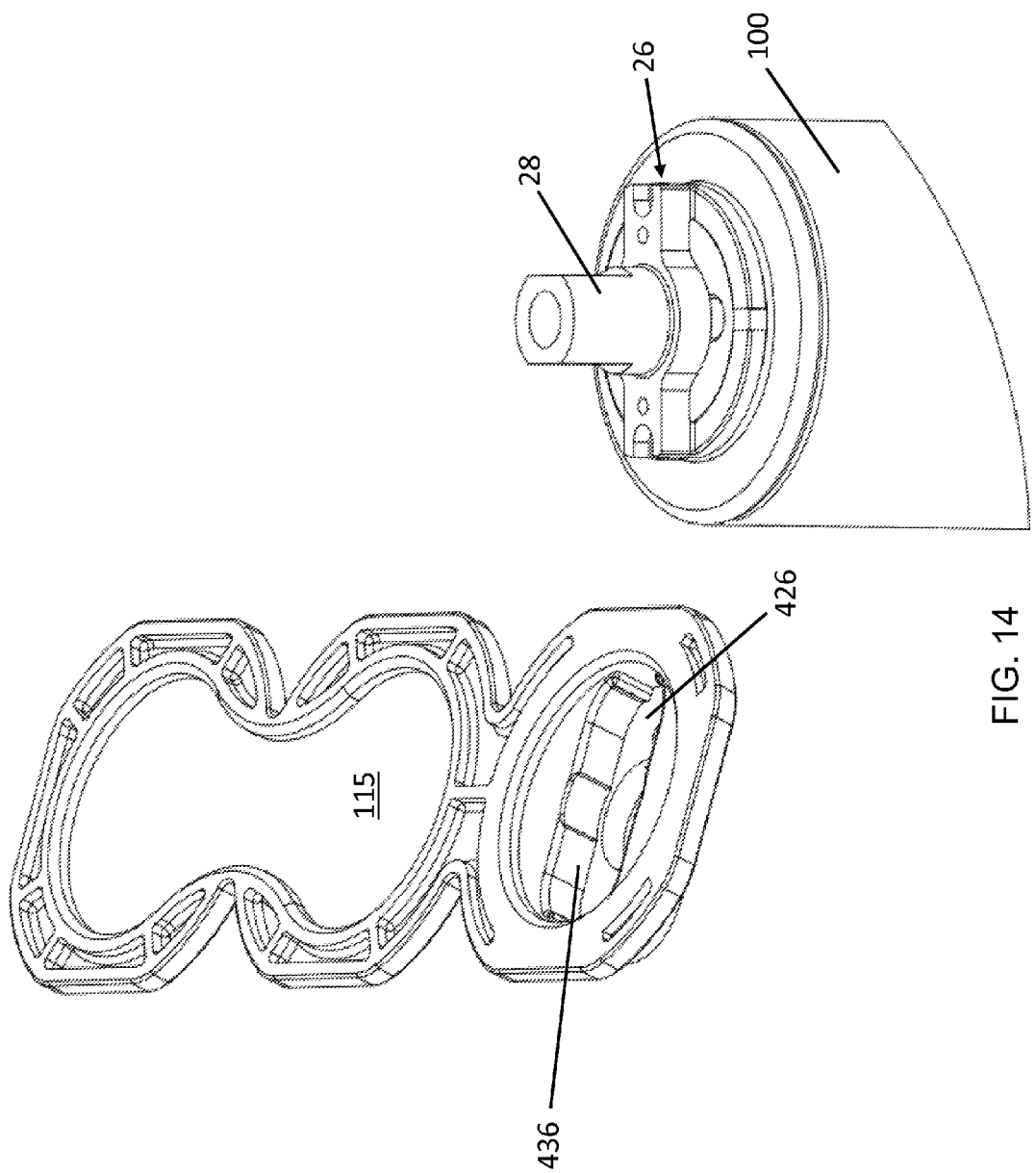
FIG. 14 shows a thermal plate, and an energy storage device with connected terminal according to embodiments of the invention.

FIG. 14 illustrates an interface between terminals 26 and segments 404 of first or second thermal plates 122, 124 according to an embodiment. Terminal 26 can be connected to energy storage device 100 before engaging segments 404 or other corresponding structure of structural thermal bridge 50. Elongated sleeve housing 20 is shown to be coupled to several energy storage devices 100, which can be connected to each other in series, e.g., at their first and second projecting electrodes 102, 104. A plurality of wiring harnesses 302 can couple circuit board 140 to energy storage devices 100, such that electrical communication between each energy storage device 100 and circuit board 140 is provided. As discussed herein with respect to FIG. 4, fasteners 212 can allow wires or wire leads from wiring harnesses 302 to be electrically coupled to energy storage devices 100.

In some embodiments, the scalable length of elongated sleeve housing 20 and its physical contact with each enclosed energy storage device 100 allows each wiring harness 302 to be similar or substantially identical to each other. Using substantially identical wiring harnesses 302, when permitted by elongated sleeve housing 20, allows each energy storage device 100 to be connected to circuit board 140 according to a uniform design.

Figure 15:
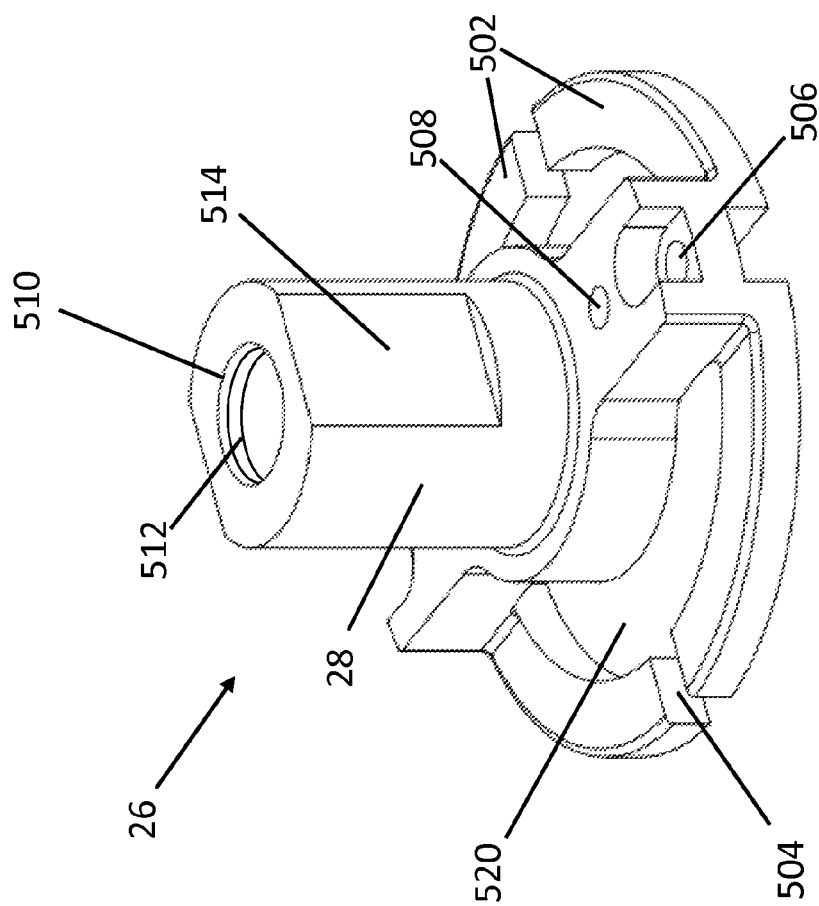
FIG. 15 shows a perspective view of a terminal according to embodiments of the invention.
Figure 16:
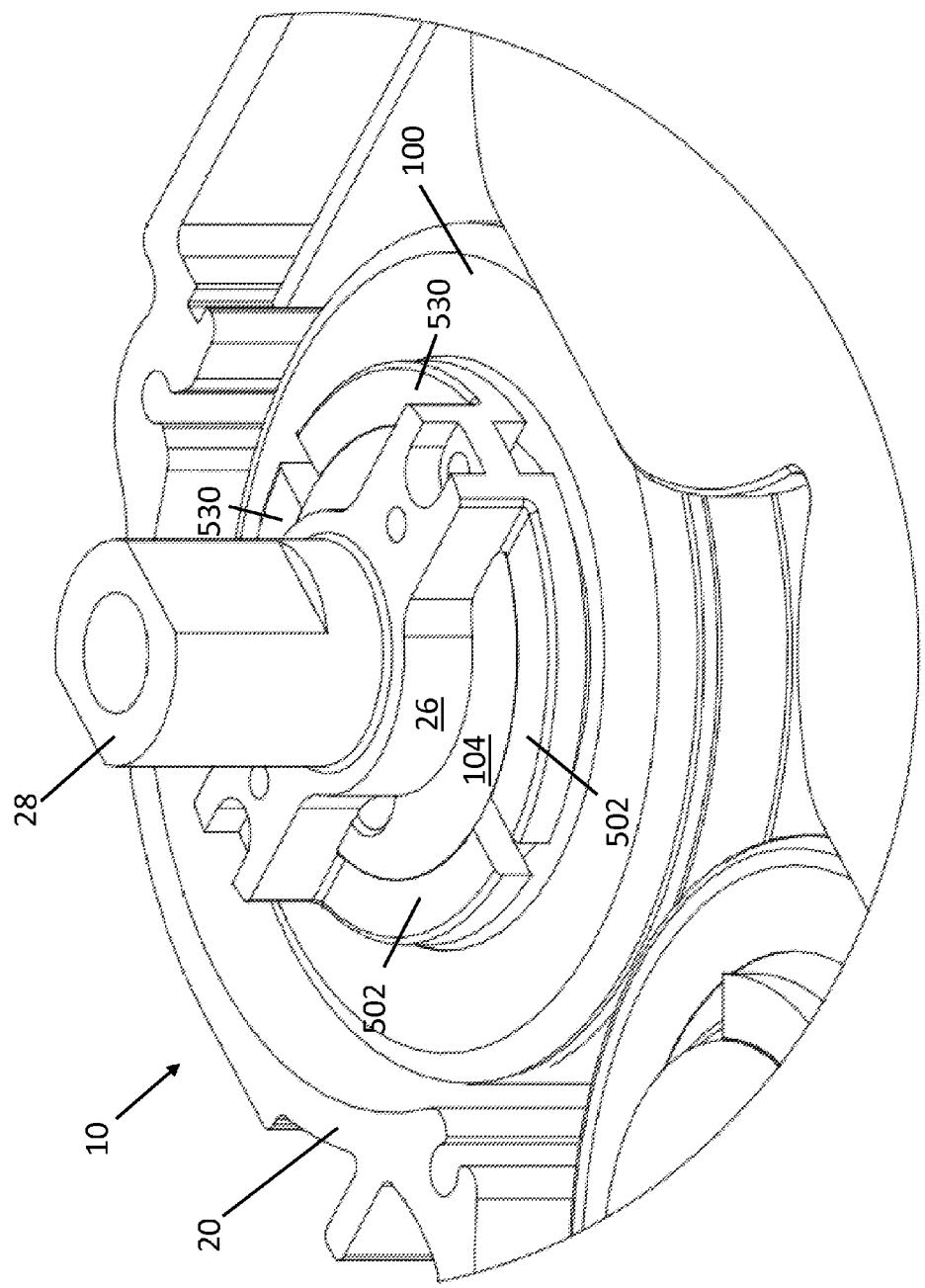
FIG. 16 shows a perspective view of a terminal in position on an energy storage device according to embodiments of the invention.

Turning to FIG. 15, assembly 10 can include a set of terminals 26 for use with energy storage devices 100. Terminals 26 can be shaped differently from previously known terminals. For example, in conventional assemblies, a terminal could comprise a cup that sits on a capacitor and totally encloses an end or tip of the capacitor. As such, this terminal would traditionally press-fit or be welded radially at a point where the terminal contacts the capacitor, to secure the terminal to the capacitor. In contrast, disclosed terminals 26 can include a set of arcuate flanges 502 which provide circumferential connection to first or second projecting electrodes 102, 104 of energy storage device 104.

Arcuate flanges 502 can be disposed proximate one another and/or be separated by a set of notches 504. Notches 504 can enable set of arcuate flanges 502 to be adjustable or bendable relative one another, and/or allow connection to energy storage device 100. Terminal 26 can also engage or connect to projecting electrodes 102, 104 of energy storage device 100. In this context, connections can be provided through interfaces such as press fits, snap fits, interference fits, and/or matingly engagable parts. A first set of apertures 506 may be located in set of arcuate flanges 502 to aid in electrically connecting terminals 26 to circuit board 140, optionally through wiring harness 302. A second set of apertures 508 can be provided to couple terminals 26 to previously described first and second plates 12, 14, first and second thermal plates 122, 124, and/or elongated sleeve housing 20.

Terminal 26 can include connector 28, which can protrude from terminal 26, optionally through one of the first and second plates 12, 14 and/or one of the first and second thermal plates 122, 124 for electrical contact between energy storage devices 100 and components, e.g., equipment outside energy storage device assembly 10. In some embodiments, connector 28 defines a terminal aperture 510, which can be configured to matingly receive an electrical contact and/or adapter to provide electrical contact. In an embodiment, terminal aperture 510 can include threads 512, which thereby can allow terminal 26 to connect with a threaded plug (not shown).

In another embodiment, connector 28 can define a connector surface 514 configured to connect to a plug, application, and/or a tool. Connector surface 514 can be in the form of a patterned surface, flattened surface, or similar geometry for engaging other components. Connector 28 can be substantially centrally located relative to set of arcuate flanges 502, and can directly contact energy storage devices 100. A gap 520 can be present between sets of arcuate flanges 502 and connector 28. Gap 520 can be configured to matingly receive projecting electrodes 102, 104 of energy storage device 100 and provide access to an interface 530 (shown in FIG. 16) between connector 28 and energy storage device 100.

In some embodiments, terminal 26 can be welded circumferentially on projecting electrodes 102, 104 of energy storage devices 100. For example, as shown in more detail in FIG. 16, assembly 10 can include terminal 26, welded circumferentially to first or second projecting electrode 102, 104 along interface 530 between set of flanges 502 and first or second projecting electrode 102, 104. Terminal 26 is further shown to be aligned circumferentially about a first or second projecting electrode 102, 104, and can connect to energy storage device 100 along weld region 532.

Figure 17:
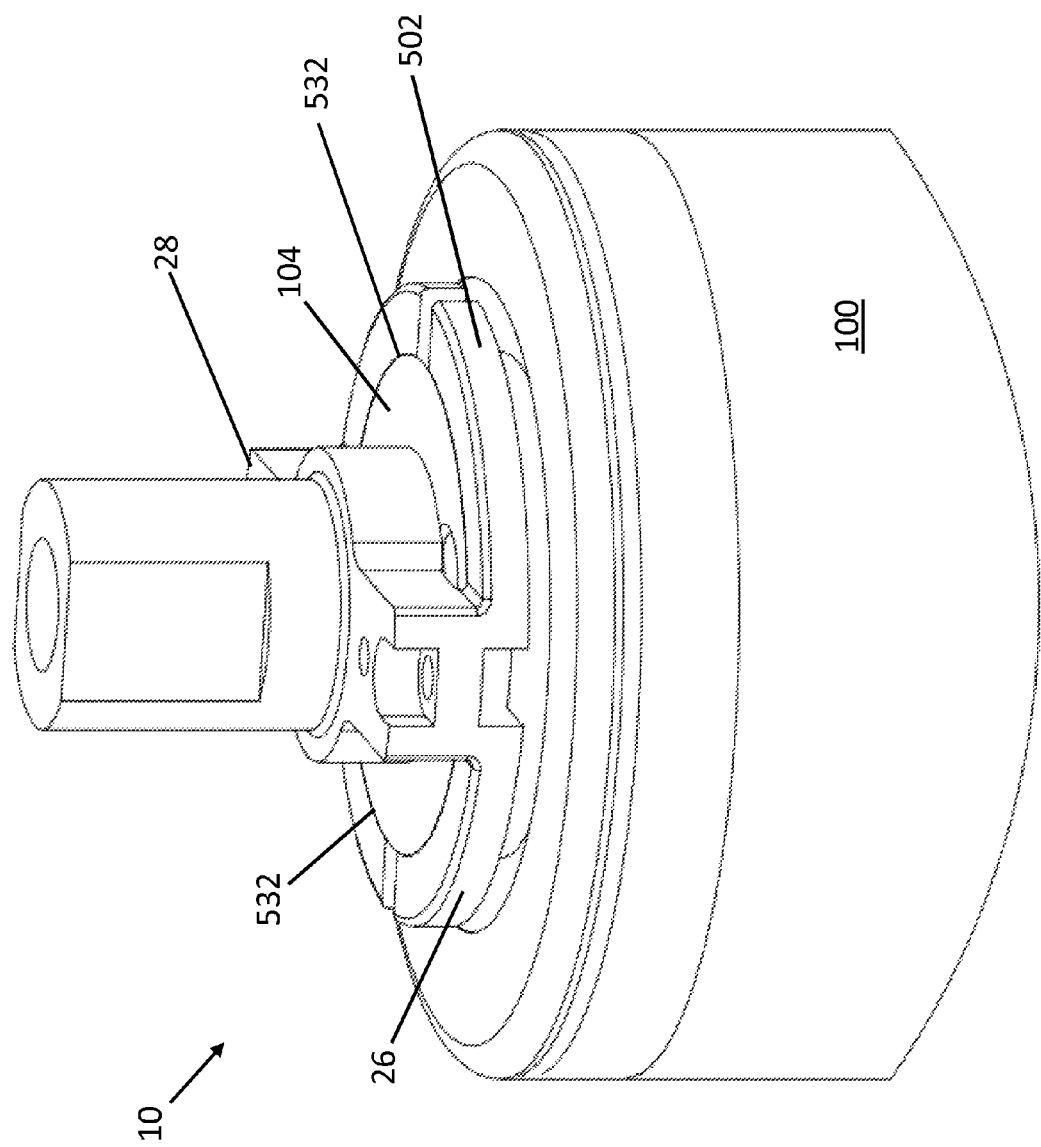
FIG. 17 shows a perspective view of a terminal bonded to an energy storage device according to embodiments of the invention.
Figure 18:
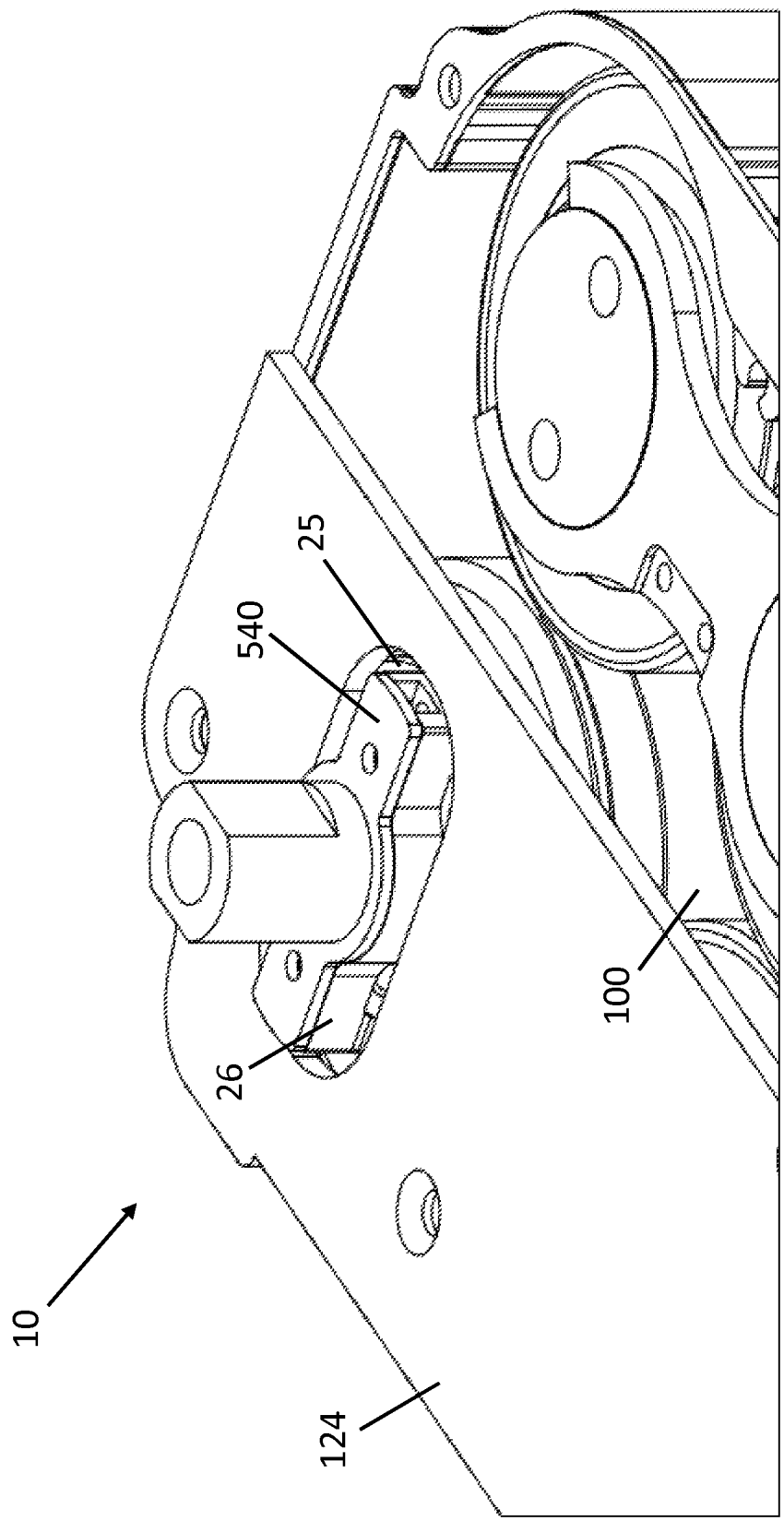
FIG. 18 shows a perspective view of a terminal passing through a structural thermal bridge according to embodiments of the invention.

A process for engaging terminal 26 on energy storage device 100 is shown in further detail in FIGS. 17, 18. FIG. 18 shows an embodiment with which a weld joint 532 can be formed at or applied to interface 530 via access created by gap 520. Following formation of weld joint 532, as shown in FIG. 18, second plate 124 can matingly engage or contact energy storage devices 100 and/or terminal 26 such that connector 28 extends through aperture 25. Furthermore, terminal 26 can be dimensioned to matingly engage second plate 124. In this configuration, torque imparted by tightening a terminal fastener 540 in to terminal 26 can be distributed to other energy storage devices 100 in assembly 10, thereby reducing direct torque on welded areas about terminal 26.

Figure 19:
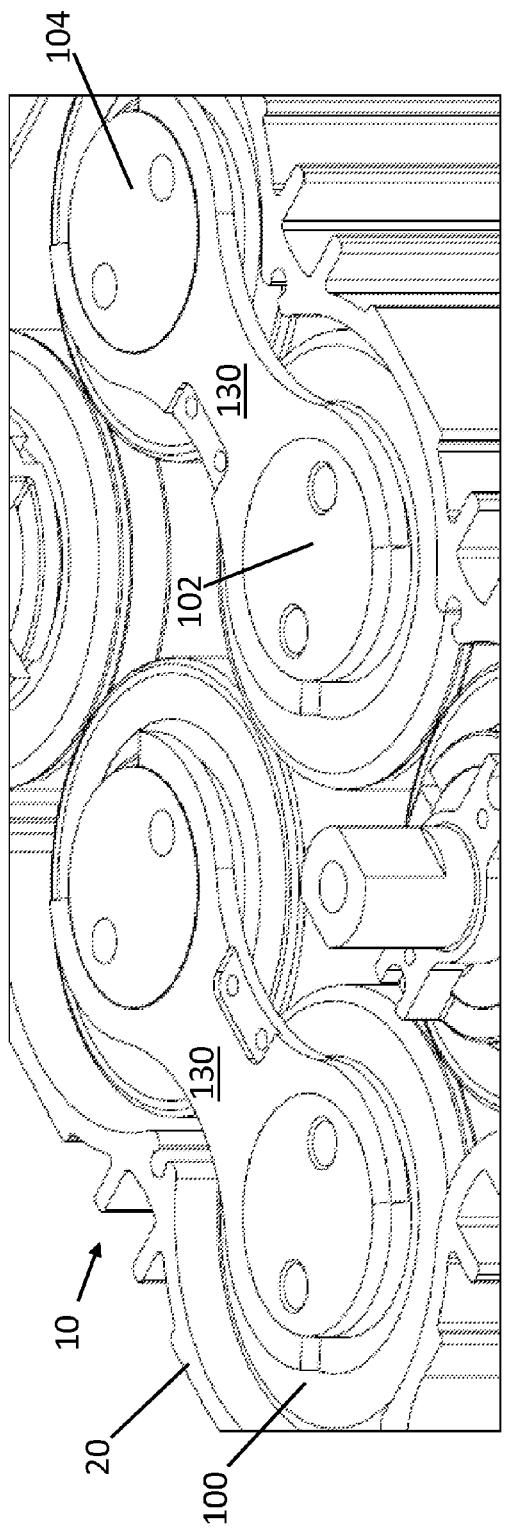
FIG. 19 shows several bus bars and terminals connected to energy storage devices according to embodiments of the invention.

As shown in FIG. 19, assembly 10 can also include one or more bus bars 130 to connect parallel sets of energy storage devices 100. A notched bus bar 130 according to an embodiment of the disclosure can be made of an electrically conductive material such as metals, e.g., aluminum, steel, tin plated copper, etc. Bus bar 130 can connect groups of series energy storage devices 100, or can group together parallel sets of energy storage devices 100. Similar to terminal 26 discussed previously, bus bar 130 can be circumferentially connected to a projecting electrode 102, 104 of energy storage devices 100. Each bus bar 130 can communicate electricity between the adjacent energy storage devices 100 coupled thereto.

Figure 20:
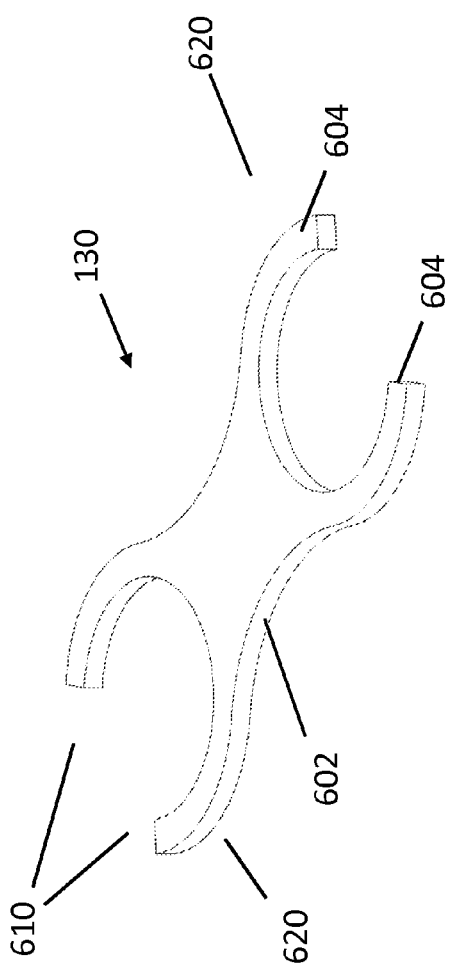
FIG. 20 shows a perspective view of a bus bar according to embodiments of the invention.

An embodiment of notched bus bar 130 is shown in FIG. 20. Notched bus bars 130 can be configured to connect energy storage devices 100 at their projecting electrodes, 102, 104. Bus bar 130 can include a base 602 and one or more bus flanges 604 connected to base 130. One or more bus flanges 604 can extend from base 602 and can engage or connect with projecting electrode 102, 104 of an energy storage device. Bus flanges 604 can be dimensioned to have varying geometries, including arcs, rigid lines, crescent-type geometries, or other geometries as may be desired, in order to provide contoured regions of contact between bus bar 130 and energy storage devices 100.

Bus flanges 604 can be shaped to form notch 610, which can improve flexibility of bus flanges 604 to allow notched bus bar 130 to be installed on an energy storage device. Notch 610 can further allow bus flanges 604 to flex within the plane of body 602, such that one of bus flanges 604 may be spatially displaced from another. Spatial displacement between bus flanges 604 can improve the contour of contact areas between bus bar 130 and energy storage device 100. This flexibility can provide a secure electrical connection between individual energy storage devices 100 and bus bar 130 without risking electrical shorts, current leakage, etc. In some cases, bus flanges 602 can reduce or even neutralize external forces acting against energy storage devices 100. Notched bus bars 130 can also be bonded or otherwise affixed to energy storage devices 100 through welding or other forms of structural bonding to increase stability of energy storage device assembly 610.

Bus flanges 602 can be shaped to form two or more substantially circular ends 620, with each end 620 connected through base 602. Generally, substantially circular ends 620 can also be substantially circular. Substantially circular ends 620 can thus be configured to engage circumferentially one of the projecting electrodes 102, 104 of an energy storage device 100. Substantially circular ends 620 can therefore geometrically accommodate energy storage devices 100 of varying geometrical design. Substantially circular ends 620 can be configured to be partially circular, instead of completely circular, to avoid situations in which exact geometrical alignment between bus bar 130 and energy storage devices 100 would be necessary. Thus, substantially circular ends 620 can engage either projecting electrode 102, 104 of energy storage devices 100 without completely enclosing the device.

Some advantages offered by including one or more substantially circular ends 620 in bus bar 130 can include an ability to connect bus bars 130 to energy storage devices 130 through a light press fit, and the adaptability of bus bar 130 to design or manufacturing variances between numerous energy storage device assemblies 10. Furthermore, any desired number of bus bars 130 can be used to connect energy storage devices 100 in energy storage device assemblies 10, improving the structural stability and operability of the previously discussed components, such as structural thermal bridge 50, plates 12, 14, and/or thermal plates 122, 124.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An apparatus for use in an energy storage device assembly including a plurality of energy storage devices, the apparatus comprising:
   a structural thermal bridge including at least one thermal plate configured to engage an end of a pair of adjacent energy storage devices to physically secure the energy storage devices and thermally communicate heat therefrom, wherein the at least one thermal plate includes: a concave recess shaped to matingly receive and abut a projecting electrode of one of the plurality of energy storage devices and a bus bar that engages an outer periphery of the projecting electrode; and
   an elongated sleeve housing surrounding the plurality of energy storage devices.

2. The apparatus of claim 1, wherein the structural thermal bridge further includes:
   a first thermal plate positioned between the elongated sleeve housing and an end of the pair of adjacent energy storage devices, the first thermal plate including a plurality of recesses shaped to engage the projecting electrode and the axial end of each of the pair of adjacent energy storage devices; and
   a second thermal plate positioned between the elongated sleeve housing and an opposing end of a different pair of adjacent energy storage devices, the second thermal plate including a plurality of recesses shaped to engage the projecting electrode and an axial end of each of the different pair of energy storage devices.

3. The apparatus of claim 1, further comprising a thermal transmitting mechanism interposed between the elongated sleeve housing and the plurality of energy storage devices.

4. The apparatus of claim 3, wherein the thermal transmitting mechanism comprises a material selected from the group consisting of a resin, an epoxy, and a phase change material.

5. The apparatus of claim 1, wherein the at least one thermal plate includes an opening for a terminal coupled to one of the plurality of energy storage devices to pass therethrough, wherein the at least one thermal plate dissipates heat from the terminal.

6. The apparatus of claim 1, wherein the concave recess includes a contoured profile shaped to engage to an outer periphery of the bus bar and an outer periphery of the projecting electrode.

7. The apparatus of claim 1, wherein at least one of a material composition of the structural thermal bridge and a physical structure of the structural thermal bridge is configured to provide a predetermined thermal transmission level.

8. The apparatus of claim 1, wherein the elongated sleeve housing further comprises an interior mount configured to retain a circuit board therein.

9. The apparatus of claim 1, wherein at least one of the thermal plates includes a plurality of mechanically connected segments.

10. The apparatus of claim 9, wherein one of the plurality of mechanically connected segments further includes a recess configured to engage an end of one of the plurality of energy storage devices and a substantially crescent-shaped bus bar therein.

11. The apparatus of claim 1, further comprising a first gasket circumferentially engaging an exterior of the at least one thermal plate to fluidly seal the plurality of energy storage devices within the energy storage device assembly and against the at least one thermal plate.

12. The apparatus of claim 11, further comprising an electrically insulative thermal insert positioned circumferentially about an end-to-end connected pair of first and second projecting electrodes of axially adjacent energy storage devices, the electrically insulative thermal insert in thermal communication with the elongated sleeve, wherein the first electrically insulative thermal insert includes an axially sloped body having a first end and a second end, the first end having a greater cross-sectional area than the second end.

13. The apparatus of claim 1, wherein the concave recess includes a first portion abutting the projecting electrode and a bus flange of the bus bar, and a second portion abutting a base of the bus bar, wherein the second portion has a reduced lateral width relative to the first portion.

14. The apparatus of claim 1, wherein a depth of the first portion of the concave recess within the thermal place is substantially equal to a depth of the second portion of the concave recess within thermal plate.

15. The apparatus of claim 1, wherein an axial end of the projecting electrode and an axial end of the bus bar contact the thermal plate at the concave recess along a single plane of contact.

16. The apparatus of claim 1, wherein an axial thickness of the concave recess of the thermal plate is less than an axial thickness of the thermal plate, along the axial orientation of the plurality of energy storage devices.

17. The apparatus of claim 1, further comprising a thermally conductive resinous material within the elongated sleeve housing and at least partially encapsulating the plurality of energy storage devices and the structural thermal bridge.

* * * * *